(12) United States Patent
Lewyn

(10) Patent No.: US 8,604,962 B1
(45) Date of Patent: Dec. 10, 2013

(54) ADC FIRST STAGE COMBINING BOTH SAMPLE-HOLD AND ADC FIRST STAGE ANALOG-TO-DIGITAL CONVERSION FUNCTIONS

(71) Applicant: Lewyn Consulting, Inc., Laguna Beach, CA (US)

(72) Inventor: Lanny L Lewyn, Laguna Beach, CA (US)

(73) Assignee: Lewyn Consulting Inc, Laguna Beach, CA (US)

( * ) Notice: Subject to any disclaimer, the term of this patent is extended or adjusted under 35 U.S.C. 154(b) by 0 days.

(21) Appl. No.: 13/688,203

(22) Filed: Nov. 28, 2012

(51) Int. Cl.
H03M 1/34 (2006.01)

(52) U.S. Cl.
USPC .......................................... 341/162; 341/161

(58) Field of Classification Search
USPC ................................. 341/161–162
See application file for complete search history.

(56) References Cited

U.S. PATENT DOCUMENTS 6,396,429 B2 * 5/2002 Singer et al. ................. 341/155
6,469,652 B1 * 10/2002 Aude ............................ 341/172
6,956,519 B1 * 10/2005 Huang et al. ................. 341/172
6,977,606 B2 * 12/2005 Daito ........................... 341/161
7,148,833 B1 * 12/2006 Cho et al. .................... 341/162
2007/0247348 A1 10/2007 Rezayee et al.

OTHER PUBLICATIONS

Devarajan, Siddharth, et al., "A 16-bit, 125 MS/s, 385 mW, 78.7 dB SNR CMOS Pipeline ADC," Dec. 2009, pp. 3305-3313, vol. 44, No. 12, IEEE J. Solid-State Circuits, USA.

Nazemi, A., et al., "A 10.3GS/s 6bit time-interleaved-pipelined ADC using open-loop amplifiers and digital calibration in 90nm CMOS," Jun. 2008, pp. 18-19, 2008 IEEE Symposium on VLSI Circuits, USA.

* cited by examiner

Primary Examiner — Khai M Nguyen
(74) Attorney, Agent, or Firm — Jeffrey Pearce

(57) ABSTRACT

A first stage circuit for a pipeline ADC first stage combines the functions of an input sample-and-hold-plus-amplifier (SHA) stage, and the functions of the first analog-to-digital conversion stage of an ADC, including a multiplying DAC (MDAC), stage-flash ADC (SFADC) comparators, and residue opamp (RAMP). The ADC first stage is duplicated, inputs and outputs are connected, and an autozero circuit using a switched-capacitor filter feedback loop controls the RAMP bias circuitry to reduce 1/f noise and DC offsets. The sampling capacitors may be connected to the ADC input for one full sample clock time period and are disconnected from the analog input period before connecting the sampling capacitors to an amplifier voltage output or voltage reference, thereby sampling the input and allowing sufficient time for the SFADC comparators to resolve and control the MDAC capacitor settings with a low metastability error rate.

23 Claims, 12 Drawing Sheets

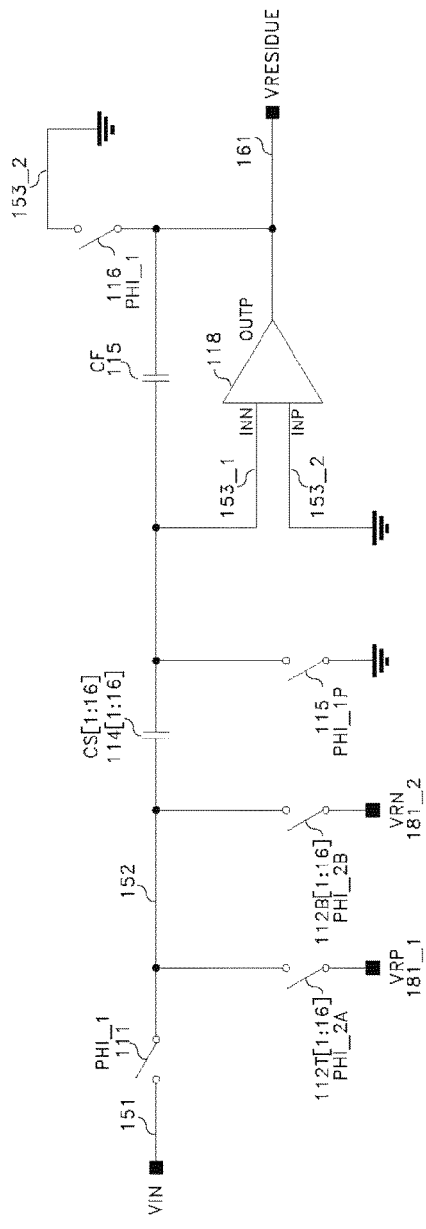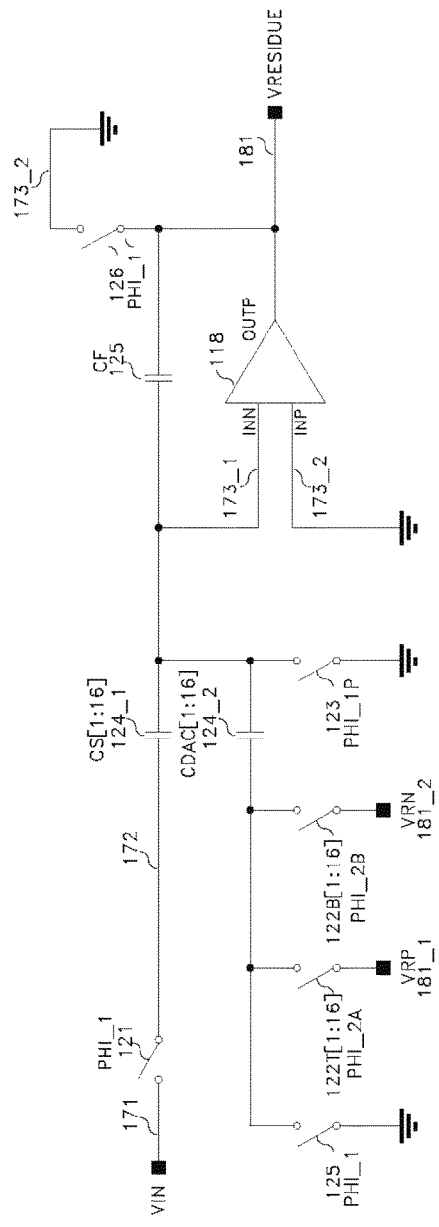
Fig. 1a (Prior Art)
Fig. 1b (Prior Art)

ADC FIRST STAGE COMBINING BOTH SAMPLE-HOLD AND ADC FIRST STAGE ANALOG-TO-DIGITAL CONVERSION FUNCTIONS

TECHNICAL FIELD

This invention pertains to analog-to-digital converters (ADCs), and particularly to ADCs for telecommunication applications fabricated using integrated circuit (IC) technology.

BACKGROUND OF THE INVENTION

The integrated circuit (IC) electronics industry is currently expending significant amounts of research money on improving the performance of ADCs telecommunication applications. Applications ranging from mobile communications to copper and fiber networks are requiring higher speeds and lower power. Pipeline ADC architectures are the most commonly chosen for these applications as they provide a good combination of high speed and low power. However, the most common pipeline ADCs must be preceded by a sample-and-hold-plus-amplifier (SHA) stage which significantly increases the amount of power required by the ADC. Extensive research efforts in IC pipeline ADC technology have been directed toward the goal of modifying the first pipeline stage so that it can also sample and hold the input signal, thereby avoiding the requirement for a separate input SHA stage, and eliminating its high power consumption.

The SHA stage preceding the first stage of a pipeline ADC is sometimes referred to as a track and hold (TH) stage. This is because it more accurately describes the process of tracking the analog input signal when charge storage devices, such as a plurality of sampling capacitors (CS) are connected to track the analog input signal in a TRACK mode, during a TRACK time interval, and then sampling the analog input signal in synchronization with an ADC SAMPLE CLK edge by holding a sample of the input signal on the sampling capacitors in a HOLD mode. That sample is then passed to the first stage of the several analog-to-digital conversion stages of the pipeline. The SHA stage often includes an additional amplifier, an input buffer amplifier (BAMP), which can buffer the ADC input to supply the large on-chip charge-discharge currents required by capacitors when tracking a fast, or high frequency, input signal.

One unfortunate characteristic of a high-speed TH or SHA input stage is that in order to not substantially degrade the signal-to-noise dynamic range (SNDR) characteristics of the subsequent pipeline stage, it must consume a high fraction of the total ADC power. Because the noise of either a TH or a pipeline ADC stage is inversely proportional to the size of the plurality of sampling capacitors in the stage, it is not unusual to find the value of the TH or SHA sampling capacitors to be twice the size of the capacitors in the first pipeline ADC stage. This large size is used to prevent the TH stage from significantly increasing the total ADC noise. However, because the power required to drive the TH CS is proportional to its size, the TH stage power often equals the total power of all the ADC pipeline stages.

A pipeline ADC first stage that includes the sample-and-hold or TH function is commonly known as an "SHA-less pipeline ADC first stage." One such successful attempt to eliminate the input SHA has been disclosed in "A 16-bit, 125 MS/s, 385 mW, 78.7 dB SNR CMOS Pipeline ADC," IEEE J. Solid-State Circuits, vol. 44, no. 12, December 2009, pp. 3305-3313, by Siddharth Devarajan, Larry Singer, Dan Kelly, Steven Decker, Abhishek Kamath, and Paul Wilkins. The Devarajan reference describes in detail the power savings that can be obtained by eliminating the input SHA stage, the problems that must be overcome, and the problems which remain that have not been overcome in their solution to the problem. It should be noted that this reference is the result of work on SHA-less pipeline ADC research by one of the leading companies in the field of high-speed analog to digital converters, and that this research work was published and considered to be original and significant by the leading journal for solid state circuits, namely, the IEEE Journal of Solid State Circuits.

The Devarajan reference describes several reasons why a common prior-art pipeline ADC first stage cannot be used to also perform the SH (or TH) function. With reference to prior-art FIG. 1a, and the remaining drawings, switch control signal names, such as PHI_1, are placed directly over the switch number callout, such as 111, to designate that switch 111 is controlled by logic signal PHI_1. In FIG. 1a, during TRACK the charging of Cs to the input voltage is possible because while the Cs input plates 152 are connected to VIN 151 through switch 111, controlled by logic signal PHI_1, the output plates 153_1 are connected to signal ground by switch 115a, controlled by logic signal PHI_1P. At the same time, the feedback capacitor CF is discharged and switchably connected to signal ground 153_2 by switch 116, controlled by logic signal PHI_1. During HOLD, switches 112T[1:16] and 112B[1:16] are controlled by logic signals PHI_2A and PHI_2B, respectively to connect the input plates 152 of Cs to positive or negative reference voltages VRP or VRN. However which ones of switches 112T and 112B are closed during HOLD are determined by the value of voltage VIN, which is quantized by a stack of a few capacitors in a flash ADC arrangement comprising a stage ADC, or SADC.

The residual charge error from the capacitor voltage switching process is amplified by the stage residue amplifier, or RAMP 118, with inputs INN 153_1 and INP 153_2, and positive output OUTP which produces residue output VRESIDUE on wire 161. The feedback capacitor CF 115 from the RAMP output 161 to input is usually set to achieve a precise low gain, such as 2, 4, or 8 by setting its value to the appropriate fraction of the total CS value. The combination of sampling, DAC, feedback capacitors, and RAMP is commonly referred to as the multiplying DAC, or MDAC, of the pipeline stage.

The Devarajan reference describes several reasons why the ADC first stage of FIG. 1a cannot be used to also perform the SH (or TH) function. One of the reasons is that after HOLD, when the switches 114[1:16] subsequently re-connect the Cs capacitors to the input in the next TRACK interval, they have stored a residual nonlinearly-quantized version of the previous input voltage and an error charge kick is given to the BAMP output. That output must rapidly settle to the new value of the input voltage. Any failure to achieve complete voltage settling results in a small nonlinear error. This error, whose value is computed in the Devarajan reference, is small but significant, and is proportional to the difference between the true value of the previous input voltage and the nonlinearly-quantized estimate of the previous input voltage.

The Devarajan reference also describes how the small nonlinear errors may be eliminated using another prior-art method. In that method (prior-art FIG. 1b.), the unit capacitors CS[1:16] 124_1 used to sample the input signal VIN 171 are separate from the DAC capacitors CDAC[1:16] 124_2 that are used to feed back a quantized approximation of the input signal. Because the capacitors are separate, the charge across CS[1:16] can be forced to zero during the entire HOLD half-clock cycle before being reconnected to the input during TRACK. This is accomplished by grounding the input side of CS using switch 125, controlled by logic level PHI1, while the other side of CS remains connected to ground through switch 123, controlled by PHI_1P during TRACK. The output terminal of feedback capacitor CF 125 is also reset as switch 126, controlled by PHI_1, connects it to ground 173_2 during TRACK.

During HOLD, amplifier 118 amplifies the difference voltage between INN 173_1 and INP 173_2 to produce a VRESIDUE voltage output on OUTP 181 with a forward gain determined by the ratio of feedback capacitor CF 125 to the input capacitors CS and CDAC. Unfortunately, for a given forward gain, the additional CDAC capacitors at the amplifier input increase the input capacitive load by approximately a factor of 2 as one plate remains connected to VRP or VRN by either switches 122T or 122B which are controlled by PHI_2A or PHI_2B during HOLD. The CDAC capacitors degrade the feedback loop gain approximately by a factor of 2. Therefore the amplifier then must be supplied twice as much power to regain the bandwidth lost by the loop gain degradation. Hence, the solution to the separating the CS and CDAC capacitors is not a viable low-power solution for high sample rate ADC applications.

The Devarajan reference describes a new low-power solution, shown in FIG. 2a, that uses just the input sampling capacitors 214[1:16] to combine the CS[1:16] and CDAC[1:16] functions shown in FIG. 1b. This solution purports to remove the residual CDAC charge by switchably connecting the input 252 of the sampling capacitors to ground 253_2 for a small portion of the clock half-cycle normally used for the signal-tracking (TRACK) time interval. Switches 212T, 212B, and 216 which are controlled by logic signals PHI_2A, PHI_2B, and in a PHI_1 function similar manner with similar timing to that already described for corresponding switches and logic signals in FIGS. 1a and 1b. The residue amplifier 218, with input INN 253_1, INP 253_2, OUT RESIDUE 261, and feedback capacitor CF 216 function in a similar manner to that already described for the corresponding amplifiers in FIGS. 1a and 1b. The switches 218[1:16] grounding the sampling capacitor input are driven by a short "clearing pulse" (PHI_CLEAR) which unfortunately consumes a portion of the TRACK half-clock interval prior to the time when switch 211, controlled by PHI_1, reconnects Cs to the input voltage VIN 251. During the time when switches 218[1:16] ground the sampling capacitor, switch 215 controlled by logic signal PHI_1P must remain on past the end of the HOLD period to insure that the switches 218 can reset the voltage across Cs to zero.

Although not discussed in the Devarajan reference, the amount of time allowed for the input capacitor to properly track the input signal is critical. The "substantially-shorter-than one-quarter clock interval" timing allocation for the clearing pulse must not overlap the TRACK interval and therefore must cause the beginning of the "shorter-than half-clock" TRACK interval to be delayed. Consequently, the BAMP driving the sampling capacitor is forced to have a shorter slew time and settling time. Shortening these times requires the BAMP to have higher bandwidth and therefore higher power. This limitation of the Devarajan reference, which is also common to any ADC using timing signals that are not at least a full one-half ADC sampling clock period in width for tracking, will be hereinafter referred to as the Shortened Tracking Time Limitation.

It is apparent that in the Devarajan reference, the input sampling capacitors are disconnected from the input buffer amplifier (BAMP) for a period of time greater than one half of the ADC sampling clock period. As is well understood by persons of ordinary skill in the design of operational amplifiers, if the ADC capacitive load on the BAMP is removed for a period of time, such as half an ADC sample clock period, the removal and consequently reduced capacitive load could lead to an instability which could cause either the output of an operational transconductance, or current-output BAMP (OTA) to begin uncontrolled oscillation for a brief period of time. To avoid the consequences of a reduced capacitive load, the BAMP can be designed to include additional output stabilization elements that would allow the capacitive load to be removed, but the added stabilization elements would also slow the time response of the amplifier. This limitation on input buffer amplifier design which arises when the output capacitive load is disconnected for a period of time such as a half-clock period, or more, will hereinafter be referred to as the ADC Input Capacitive Load Variation Limitation.

The time duration allowed to reset the input in the Devarajan reference cannot be arbitrarily shortened. Because the input sampling capacitor CS[1:16] 214[1:16] must be large enough to achieve acceptable ADC noise performance, the MOS switches 218[1:16] receiving the "clearing pulse" PHI_CLEAR must be quite large to short out the input in a time which is very small compared to the TRACK interval PHI_1. For the same reason switch 215, controlled by PHI_1P must also be large. Large devices have large parasitic junction capacitances with non-linear capacitance vs. voltage characteristics. Non-linear capacitances are well known contributors to high frequency amplifier distortion. Therefore the requirement to short out the input must not require a clearing switch that is unacceptably large in value. This requirement will be hereinafter referred to as the Clearing Switch Size Limitation, and that size limits the minimum width of the clearing pulse.

The Devarajan reference does describe how the time delay from sampling the final value of the input signal to the time that the comparators produce a reliable output adversely affects how the time available for the MDAC RAMP to fully settle is shortened. This adverse effect of the comparator time delay is to shorten the HOLD time interval. Any shortening of HOLD time available for MDAC output settling requires an increase in MDAC RAMP power to speed its response. Because the comparator delay must be kept to a small fraction of the HOLD clock width, higher ADC clock rates require shorter delay times, and consequently require that much higher power be supplied to the comparators so that they will more rapidly regenerate to a reliable answer. The effect of the comparator delay time in shortening the HOLD time available for MDAC output settling is hereinafter referred to as the Comparator Delay-Time Limitation.

The Devarajan reference qualitatively describes how the additional comparator power required to shorten the comparator delay time required to accommodate increasing ADC clock rates (shorter ADC clock periods) results in a significant sampling frequency limitation in SHA-less ADCs. The reference concludes that as required comparator power increases at some increasing-sample-rate total power inflection point, which is difficult to generally determine, it would be better to use an input SHA rather than an SHA-less configuration. As a result, the pipeline ADC in the Devarajan reference targets only a modest sampling rate of 125 megasamples per second (MSPS) using 180 nm CMOS technology. Therefore, in order to allow a sufficient MDAC RAMP settling time, SADC power considerations prevent the comparator delay time from being reduced to an arbitrarily short value, in accordance with the above-described Comparator Delay-Time Limitation.

It is not unusual to find error rate requirements of less than 10E-15 in enterprise 10 giga-sample-per-second (GSPS) fiber optic or LAN communication systems. The major contributor to such error rates is the susceptibility of the comparator to what is commonly known as comparator metastability errors. Metastability errors can be reduced by allowing the comparators to have more time to regenerate, however, the minimum acceptable regeneration time is still a large multiple, such as 35 times the comparator basic regeneration time constant ($\tau$). Even if $\tau$ is in the range of 30 picoseconds, typical of older technologies such as 180 mm, imposing a 35$\tau$ requirement for minimum delay time would consume an unacceptably-high fraction of the HOLD interval half-clock width when using the Devarajan circuit topology. Thus, the Comparator Delay-Time Limitation is a significant factor limiting sampling clock rates that must be considered in the design of any SHA-less ADC, particularly when sampling clock rates approach or exceed 1 GSPS.

If an input SHA stage is eliminated, and the input signal is not held, then the input signals may be changing rapidly at the time the first pipeline stage makes the transition from TRACK to HOLD. Therefore, the comparator stack comprising the SADC in the Devarajan reference must have fast input time-response characteristics similar to that of the BAMP charging CS. This requirement arises from the fact that although the SADC sample occurs at the same time as the input signal is sampled across CS, differences in the SADC input time response and the time response of the BAMP charging CS can result in SADC quantization error consuming an unacceptably large fraction of the MDAC error correction range. This limitation will be hereinafter referred to as the SADC-BAMP Bandwidth Matching Limitation.

The SADC-BAMP Bandwidth Matching Limitation becomes a severe limitation when the input signals have significant frequency components near the maximum bandwidth of the IC components used in the SADC-BAMP. For example, this matching limitation becomes severe when input signal bandwidths exceed 1 GHz and also in cases where multiple pipeline ADCs of lower bandwidth are interleaved to quantize higher bandwidth input signals. In such cases prior-art pipeline ADCs are preceded by an input SHA, despite its significantly higher power consumption. See, for example, "A 10.3 GS/s Gbit time-interleaved-pipelined ADC using open-loop amplifiers and digital calibration in 90 nm CMOS," 2008 IEEE Symposium on VLSI Circuits, June 2008, pp. 18-19, by A. Nazemi, C. Grace, L. Lewyn, et. al.

The Devarajan reference also describes the requirement to reduce the 1/f noise contribution of the RAMP. It avoids the technique of auto-zeroing the amplifier to reduce 1/f noise because "auto-zeroing the amplifier can help reduce 1/f noise at the expense of increased complexity and power." Unfortunately, most other methods are not nearly as effective as auto-zeroing for reducing 1/f noise. The 1/f noise limitation for an SHA-less pipeline ADCs without autozero, as described in the Devarajan reference, will hereinafter be referred to as the Partially-Corrected 1/f Noise Limitation.

It should be noted that the methods used to mitigate 1/f noise in the Devarajan reference rely simply on the use of large-gate-area PMOS devices and not on DC offset correction in the amplifier. DC offsets in amplifier topologies typical of the Devarajan reference are not corrected by additional circuitry commonly known as common-mode output DC feedback. That is because the common mode output voltage by definition has a value related only to the common mode voltage of the output voltage and not the differential offset components of the output voltage. DC offsets are becoming generally much larger as process variability affects device matching to a greater extent in deep-nanoscale CMOS technology nodes. The limitation of operating the RAMP with only common-mode DC offset correction, will be hereinafter referred to as the Amplifier Common-Mode Offset Correction Limitation, because this common-mode offset correction does not correct for input DC offsets. Additionally, because the Devarajan amplifier has a factor of 8 closed-loop forward gain, the DC output offset can be substantial, particularly in the case of deep-nanoscale CMOS nodes where process variability is a significant factor.

The Devarajan reference did not employ autozeroing as the preferred method for reducing 1/f noise or DC offset in a pipeline ADC stage for the complexity and power reasons previously stated. However, the prior art of U.S. Pat. No. 7,450,050, Nov. 11, 2008, by A. Rezayee, et. al. employed small autozeroing capacitors (CRESET_1 224-1 and CRESET_2 224-2 in FIG. 2b) and switches in an arrangement which add little complexity to the stage and, as stated in the patent, also consume little additional power. It should also be noted that although the Rezayee patent discloses an MDAC configuration that cannot be used directly as an SHA-less pipeline stage for the reasons previously stated in the Devarajan reference which pointed out the limitations of the prior art illustrated in FIG. 1a. However, the Rezayee patent circuit configuration achieves a significant bandwidth advantage over the MDAC of the Devarajan reference by pre-charging all the MDAC sampling capacitors CDAC_1P, CDAC_1N, 221-1, 221-2, CDAC_2P, CDAC_2N, 222-1, 222-2, and CF-1 [1:2], 223-1[1:2], 223-2[1:2] to the input voltage difference INPV (250_1)–INNV (250_2) during TRACK (PHI_1), and then re-using some of the sampling capacitors CF-1[1:2], 223-1[1:2], 223-2[1:2] as RAMP feedback capacitors during HOLD (PHI_2). During HOLD (PHI_2), the input capacitors 221_1, 221_2 and 222_1, 222_2 are switchably connected to wither the positive or negative voltage references VRP or VRN using the same MDAC techniques described previously with reference to FIG. 1a. The bandwidth advantage in the Rezayee circuit configuration arises because half of the sampling capacitors (the CF capacitors) are removed from the input capacitive load during the HOLD timing interval. During the HOLD interval they are placed in the feedback path as they are connected to the positive and negative voltage outputs OUTPV 273_1 and OUTNV 273_2. Unlike the opamps in the previous figures, RAMP opamp 290 has separate positive and negative inputs INP 252_1 and INN 252_2, and separate positive and negative outputs OUTP and OUTN.

The Rezayee patent discloses a method of amplifier offset correction using switched capacitor techniques which is not a common-mode feedback method, but rather an autozero method. The method uses the switching of two small reset capacitors 224-1, 224-2 between RAMP input and output during TRACK (PHI_1) using switches 203-1, 203-2 and switches 206-1, 206-2, and then to two separate amplifier input and output common-mode voltage references VCM_IN 383 and VCM_OUT 289 using reset switches 205-1, 205-2 and 206-1, 206-2 during HOLD (PHI_2). The small autozero capacitors can be used to reset the pipeline stage and set the common-mode output voltage. While not greatly amplifying the input DC offset, unfortunately the amplifier input DC offset will still be present in the RAMP output after reset. With the advancement of CMOS technology line widths shrinking down into the deep nanoscale region, it is not unusual to find high speed operational amplifier input DC offsets in the range of several tens of millivolts. The accumulation of DC offset in a sequence of pipeline ADC stages is detrimental to the overall ADC performance because it subtracts from the available voltage headroom which, in turn, limits output signal swing. Input DC offset is not corrected at the opamp output in the Rezayee patent because the target output voltage is obtained by adding the same constant reference VCM_OUT-VCM_IN voltage difference 289-383 across the 2 small capacitors to the respective amplifier inputs. The limitation of the Rezayee patent RAMP which results in the DC output offset being equal to, or slightly greater than, the input DC offset of the input will be hereinafter referred to as the Uncorrected Amplifier DC Offset Limitation.

Another limitation of the Rezayee circuit arises from the connection of the two small reset capacitors 224-1, 224-2 to the amplifier inputs through switches 203-1, 203-2 during the PHI_1 time intervals when the MDAC stage is in TRACK. While it is important that switches 203-1, 203-2 are disconnected during the HOLD timing interval, it is well known that that CMOS switches exhibit a small parasitic load capacitance and additionally, a parasitic capacitance that couples one end of the switch to the other, even when the switch is open, or disconnected. It is therefore desirable to implement autozero-mode CMOS switched capacitor offset-cancellation circuits without requiring the switch devices to be connected directly to the charge-sensitive input of the amplifier. The limitation of the Rezayee patent autozero-mode offset-correction circuitry which results in the autozero circuitry to be connected directly to the residue amplifier input will be hereinafter referred to as the Autozero-Mode Amplifier Input Offset Switch Parasitic Capacitance Limitation.

When it is necessary to save pipeline ADC power by eliminating a separate input SHA stage, what is needed is therefore a pipeline ADC topology that achieves high speed operation and also overcomes the Shortened Tracking Time Limitation, the ADC Input Capacitive Load Variation Limitation, the Clearing Switch Size Limitation, the Comparator Delay-Time Limitation, the SADC-BAMP Bandwidth Matching Limitation, the Partially-Corrected 1/f Noise Limitation, the Amplifier Common-Mode Offset Correction Limitation, the Uncorrected Amplifier DC Offset Limitation, and the Autozero-Mode Amplifier Input Offset Switch Parasitic Capacitance Limitation. This invention provides such a SHA-less pipeline ADC topology.

What is needed for high sample-rate analog to digital conversion applications is therefore a new first-stage pipeline ADC topology that achieves significantly lower power by eliminating the separate SHA stage while overcoming all of the limitations previously described.

BRIEF DESCRIPTION OF THE DRAWINGS

FIG. 1a is a schematic illustration of an ADC MDAC stage having a single input capacitor network designed to combine track-hold and first-stage ADC MDAC functions in a manner described in the prior art of Devarajan.

FIG. 1b is a schematic illustration of an ADC MDAC stage having separate input track-and-hold and DAC capacitor networks designed to combine track-hold and first-stage ADC input MDAC functions in a manner described in the prior art of Devarajan.

DETAILED DESCRIPTION

Figure 2A:
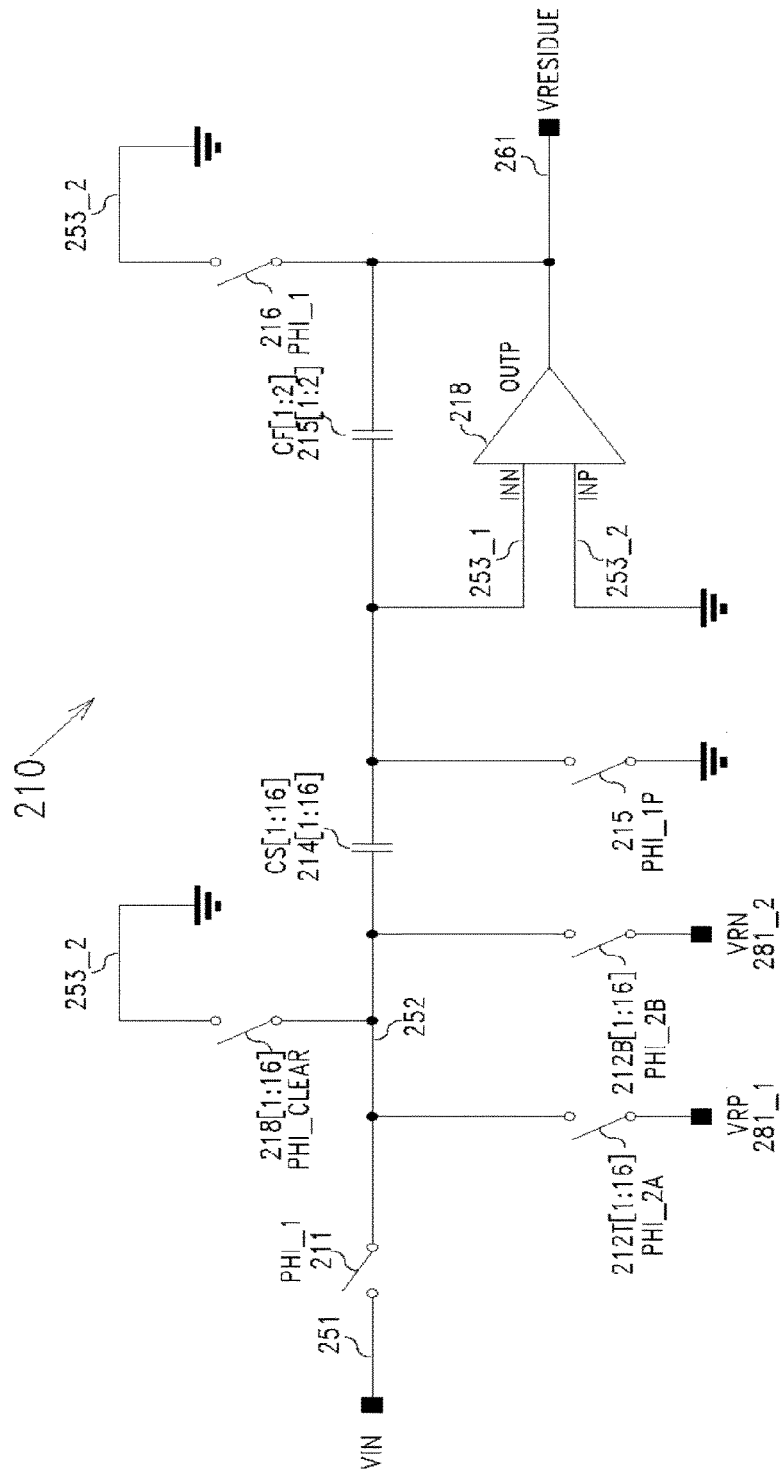
FIG. 2a is a schematic diagram illustrating the general functions and improvements designed to combine track-hold and ADC first-stage MDAC functions in a manner described in the prior art of Devarajan.
Figure 2B:
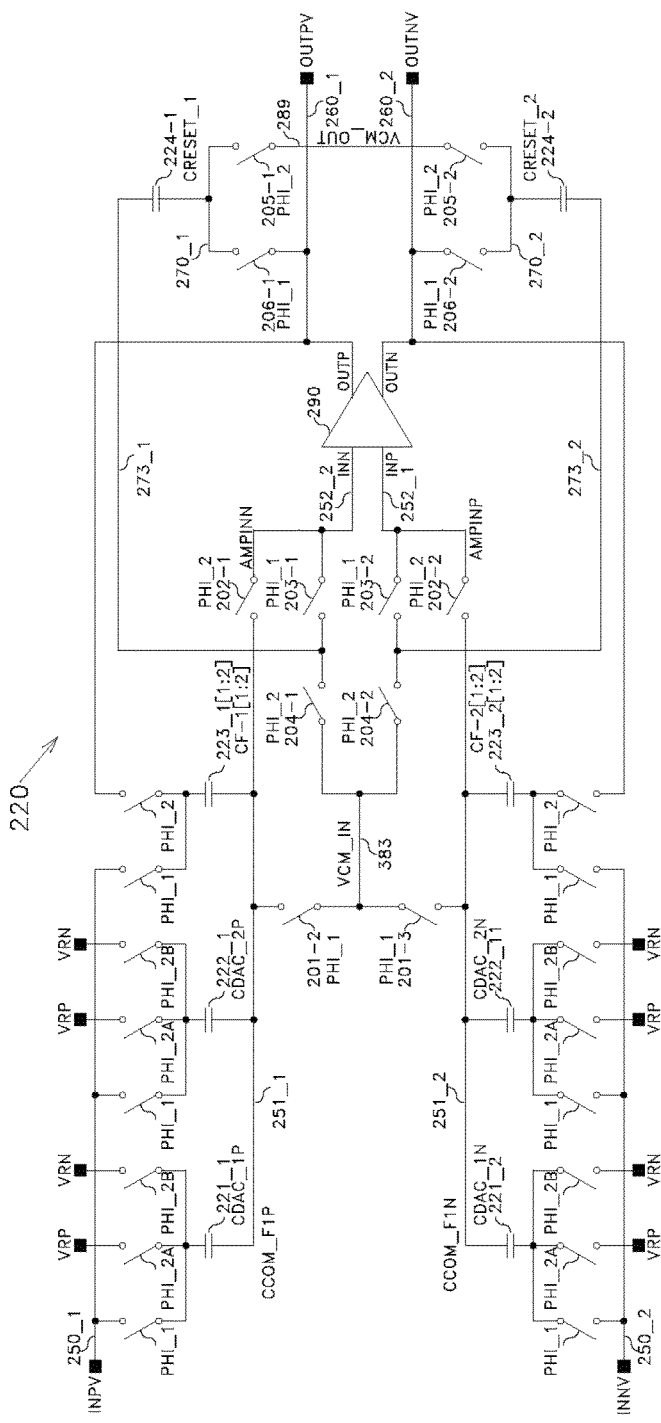
FIG. 2b is a schematic diagram illustrating the general functions and improvements designed to provide accurate reset for an ADC first-stage MDAC without combined track-hold in a manner described in the prior art of Rezayee.

Various aspects of embodiments, some or all of which may be included in different implementations of the invention, offer corresponding advantages relative to the prior art. For example, one aspect addresses the limitations present in the Devarajan and Rezayee systems to achieve SHA-less pipeline ADC sampling rates up to, and beyond, the GSPS region of operation by combining the track and hold functions of an SHA-less pipeline ADC with the first stage MDAC functions of a pipeline ADC. These limitations may be overcome by duplicating the resulting ADC first stage circuit to create a first ADC first stage and a second ADC first stage, connecting the analog inputs of the first and second ADC first stages, and providing a novel combination of CMOS capacitors, residue amplifiers, switches, autozero circuits, and different timing intervals to reduce 1/f noise contribution, DC offset, and set the residue amplifier common-mode output voltage. Such different timing intervals are facilitated by providing additional switch control circuitry to generate signals that occur with a periodicity of twice, and half, the basic ADC sampling clock rate of the prior art Devarajan and Rezayee references.

Another aspect relates to the desire to overcome the Gain-Bandwidth Limitation of each individual amplifier in the separate ADC first stages by arranging the combination of switches and the timing of the switch control signals to permit the inputs and the output of the residue operational amplifiers of the first and second of the ADC first stages to be connected to each other, respectively. Therefore one can assist the other when a HOLD amplification function is being performed. The transconductance of both then can then be used to double the gain bandwidth of the resulting combination. The common connection of the amplifier outputs then becomes the output of the SHA-less pipeline ADC first stage.

Still another aspect deals with the desire to overcome the Shortened Tracking Time Limitation by providing provide a combination of capacitors, amplifiers, switches, different timing intervals, and duplicate MDAC circuits which facilitate a TRACK time interval of 2 half ADC SAMPLE CLK periods as opposed to the TRACK time interval of less-than one-half ADC SAMPLE CLK period in the prior-art Devarajan reference. The technology disclosed herein which enables the longer TRACK time interval includes construction of two identical SHA-less pipeline ADC first stages interconnected in such a way that the amplifiers are shared between the duplicated circuits.

Yet another aspect relates to the goal of overcoming the ADC Input Capacitive Load Variation Limitation by providing a combination of capacitors, amplifiers, switches, different timing intervals, and duplicate MDAC circuits that facilitate long tracking intervals for each of the duplicate circuits in which sampling capacitor connections to the ADC input neither overlap each other, nor are separated widely in time from each other. The lack of separation, or overlap, provides a nearly-constant capacitive load for the input device or input buffer amplifier (BAMP). The technology disclosed herein can therefore use just one BAMP, with one output which can be connected to the voltage input of both of the two identical SHA-less pipeline ADC first stages.

Still another aspect involves the desire to overcome the Clearing Switch Size Limitation by providing a combination of capacitors, amplifiers, switches, different timing intervals, and duplicate MDAC circuits which facilitate a TRACK clock interval of one ADC SAMPLE CLK interval, and yet provides a time period of one-quarter ADC SAMPLE CLK period for resetting the input sampling capacitor as opposed to the "significantly-less-than-half" ADC SAMPLE CLK clearing pulse timing interval of the prior art Devarajan system.

Another aspect overcomes the Comparator Delay-Time Limitation by providing a combination of capacitors, amplifiers, switches, different timing intervals, and duplicate MDAC circuits which delay the HOLD time interval from the TRACK time interval by a time of one-quarter of an ADC SAMPLE CLK period. This delay provides a time equal to one-quarter ADC SAMPLE CLK prior to the ADC HOLD timing interval for the comparators to respond with a very low metastability error rate, as opposed to the "significantly-less-than-half" ADC SAMPLE CLK interval of the prior-art Devarajan reference, or other typical prior-art MDAC circuits.

Another aspect relates to overcoming the SADC-Bandwidth Matching Limitation by providing a combination of capacitors, amplifiers, switches, different timing intervals, and duplicate MDAC circuits which allow the incoming signal to be sampled and held STABLE for one-quarter of an ADC SAMPLE CLK period during the time that the SADC comparator samples are taken. In such case, there is no need for precise SADC-BAMP bandwidth matching as required in the Devarajan reference, or any typical prior art MDAC SADC circuit which require the comparator sampling circuitry to respond to a rapidly varying signal. In the technology disclosed herein, the BAMP bandwidth limitations have already shaped the input signal sample prior to the time that a stable sample of the input is obtained. Thereafter, a one-quarter ADC SAMPLE CLK period is provided for the SADC to respond, both with acceptable accuracy and metastability-error performance.

Still another aspect has to do with the desire to overcome the Partially-Corrected 1/f Noise Limitation, the Amplifier Common-Mode Offset Correction Limitation, and the Uncorrected Amplifier DC Offset Limitation by providing a combination of capacitors, amplifiers, and switches which consume very little additional power in a circuit topology that provides 1/f noise cancellation, output common-mode voltage correction, and input DC offset correction. Some key features of the circuit topology include switchably connecting the amplifier output to a switched-capacitor filter feedback circuit which has been designed with the objective of preventing input DC offsets from appearing at the output, reducing amplifier 1/f noise contributions from any stage in the amplifier (not just from the input stage), and setting the common mode DC output voltage to a value precisely half way between the positive and negative analog signal voltage references.

Still another aspect relates to overcoming the Autozero-Mode Amplifier Input Offset Switch Parasitic Capacitance Limitation. This limitation results when autozero-mode offset-correction switched-capacitor offset circuitry is connected directly to the residue amplifier input. It is the object of the technology disclosed herein to accomplish the autozero-mode feedback from the amplifier output by utilizing a combination of switches and capacitors which connect to the amplifier output current-biasing circuitry and not its charge-sensitive input.

1. Interconnection of the Major Blocks

Figure 8:
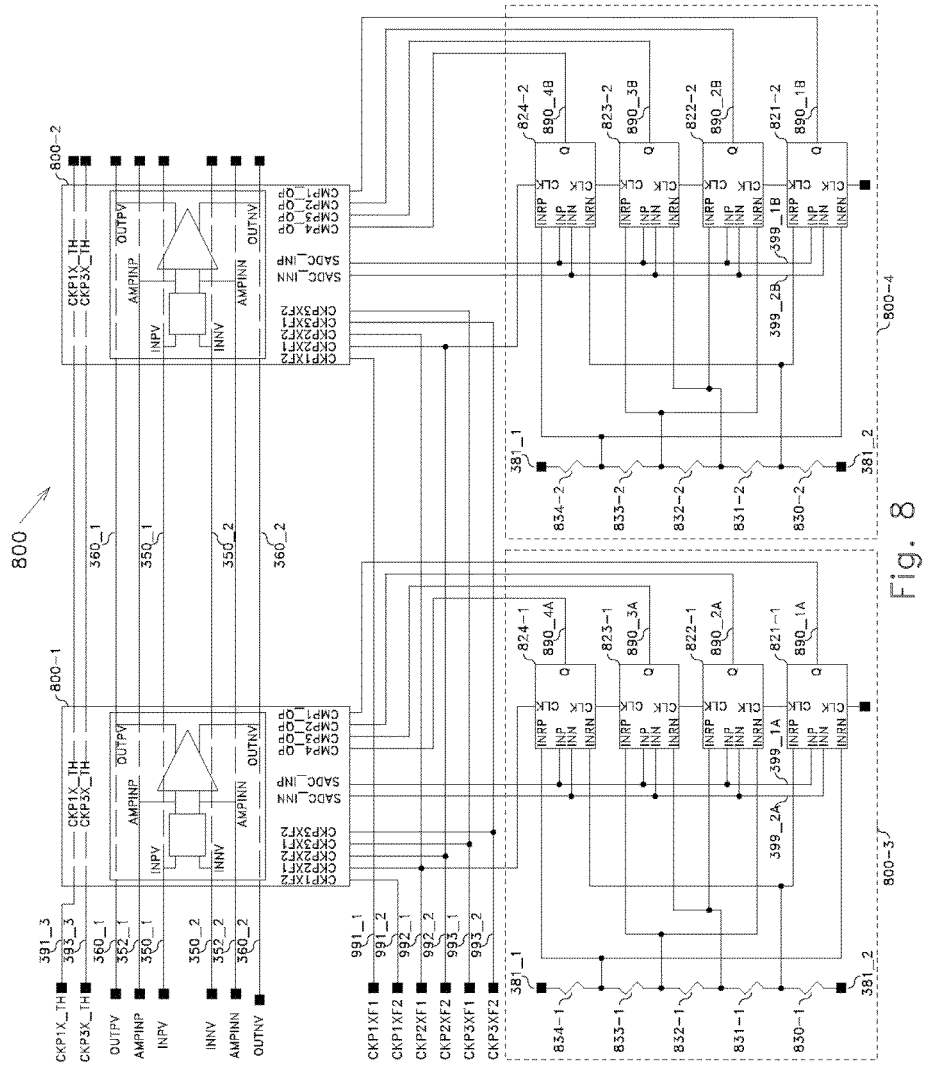
FIG. 8 is a schematic diagram illustrating the interconnection of two blocks which include identical MDAC and logic circuits and two identical stage ADC (SADC) blocks that are interconnected according to one embodiment to perform both MDAC and track-hold functions.

A schematic diagram illustrating how the major blocks of one embodiment are interconnected is shown in FIG. 8. Note that some of the principal ADC analog signals connect to both of the MDAC blocks 800-1 and 800-2. Among these signals are the joined analog ADC inputs INPV (350_1) and INNV (350_2), the joined ADC analog outputs OUTPV (360_1) and OUTNV (360_2), and the joined ADC residue amplifier inputs AMPINP (352_1) and AMPINN (352_2).

Figure 9:
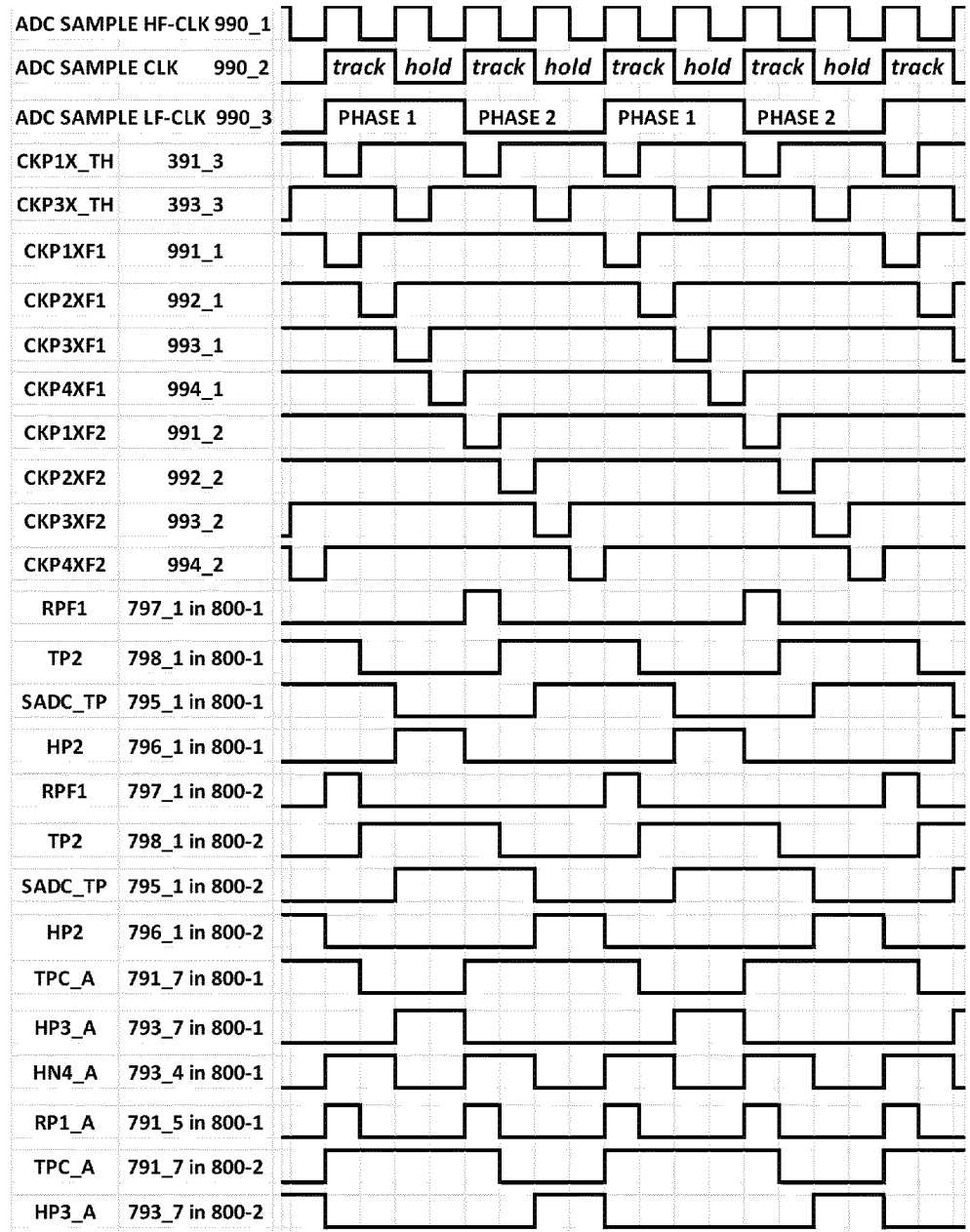
FIG. 9 is a timing diagram of the clock and control waveform 0 and 1 logic levels which are used to control and which are generated by the logic circuitry of the two MDAC and SADC blocks shown in FIG. 8.

The blocks shown in FIG. 8 require regular and recurring externally-generated timing signals, which are shown in the timing sequence of FIG. 9 as logic-level signals CKP1XTH 391_3, CKP3XTH 393_3, CKP1XF1 991_1, CKP2XF1 992_1, CKP3XF1 993_1, CKP1XF2 991_2, CKP2XF2 992_2, and CKP3XF2 993_2. While the connection of 391_3 and 393_3 are the same for both MDAC blocks 800-1 and 800-2, the connections of the remaining externally-generated timing signals are different to MDAC blocks 800-1 and 800-2. While externally-generated timing signals 991_1, 992_1, 993_1, 991_2, 992_2, and 993_2 connect to logic-level inputs CKP1XF1 391_1, CKP2XF1 392_1, CKP3XF1 393_1, CKP1XF2 391_2, CKP2XF2 392_2, and CKP3XF2 393_2 in block 800-1, these same externally-generated timing signals connect to logic-level inputs CKP1XF2 391_2, CKP2XF2 392_2, CKP3XF2 393_2, CKP1XF1 391_1, CKP2XF1 392_1, and CKP3XF2 393_1 in block 800-2, respectively.

It should be understood that while the logic timing signals are shown in FIG. 9 as rectangular waveforms, several of these waveforms are generated using logic blocks which output non-overlapping half-clock timing waveforms. It is well understood that the use of non-overlapping timing waveforms is required to prevent two CMOS switches which connect a single circuit node to two different analog voltages from being both on at the same time. For example, it is common practice to prevent TRACK and HOLD clock signals from overlapping in time. When describing typical non-overlapping clock periods, or half-clock timing intervals that are shortened by only a few percent to provide non-overlap, they will be still hereinafter referred to as "half-clock periods" or "half-clock timing intervals" and therefore treated as rectangular waveforms without shortening of a few percent in the waveform illustrations. Similarly, when describing timing events which occur earlier in time than, or prior-to others, it will be assumed that the earlier-described timing event, or waveform, occurs in the half-clock period prior to the later-described timing event, or waveform.

Timing signals 391_3 and 393_3 occur with the same periodicity as the ADC analog input signal sample rate, shown as ADC SAMPLE CLK (990_2), in FIG. 9. While the equivalent "track" and "hold" time periods for a conventional ADC are shown for 990_2 in FIG. 9, the duration, or pulse width of the TRACK time period for the embodiment disclosed herein will start earlier, end earlier, and be twice as long in comparison to the "track" and "hold" time intervals of 990_2 in FIG. 9. Also note that most of the ADC timing signals, such as 391_3 and 393_3, are substantially shorter than a half period of the ADC sample clock. These shorter duration timing signals which have a pulse width of approximately one-quarter of the ADC SAMPLE CLK period may be easily formed in the external circuitry by logically combining the ADC sample clock and another clock operating at twice the sample clock frequency such as ADC SAMPLE HF-CLK (990_1) using logic combinations well understood by any person of ordinary skill in the art of CMOS logic circuit design. Similarly, external timing signals 991_1, 992_1, 993_1, 991_2, 992_2, and 993_2 occur with a periodicity of one-half the ADC sample clock. These signals are really just a series of progressively delayed, half-width, clock waveforms that may be formed using well understood logic circuits which operate on inputs from ADC SAMPLE HF-CLK 990_1 and ADC SAMPLE LF-CLK 990_3, in FIG. 9. Note that the fourth signals in this series, "994_1" and "994_2" are not required, but are included in FIG. 9 to further illustrate the simplicity of the sequence.

Figure 3A:
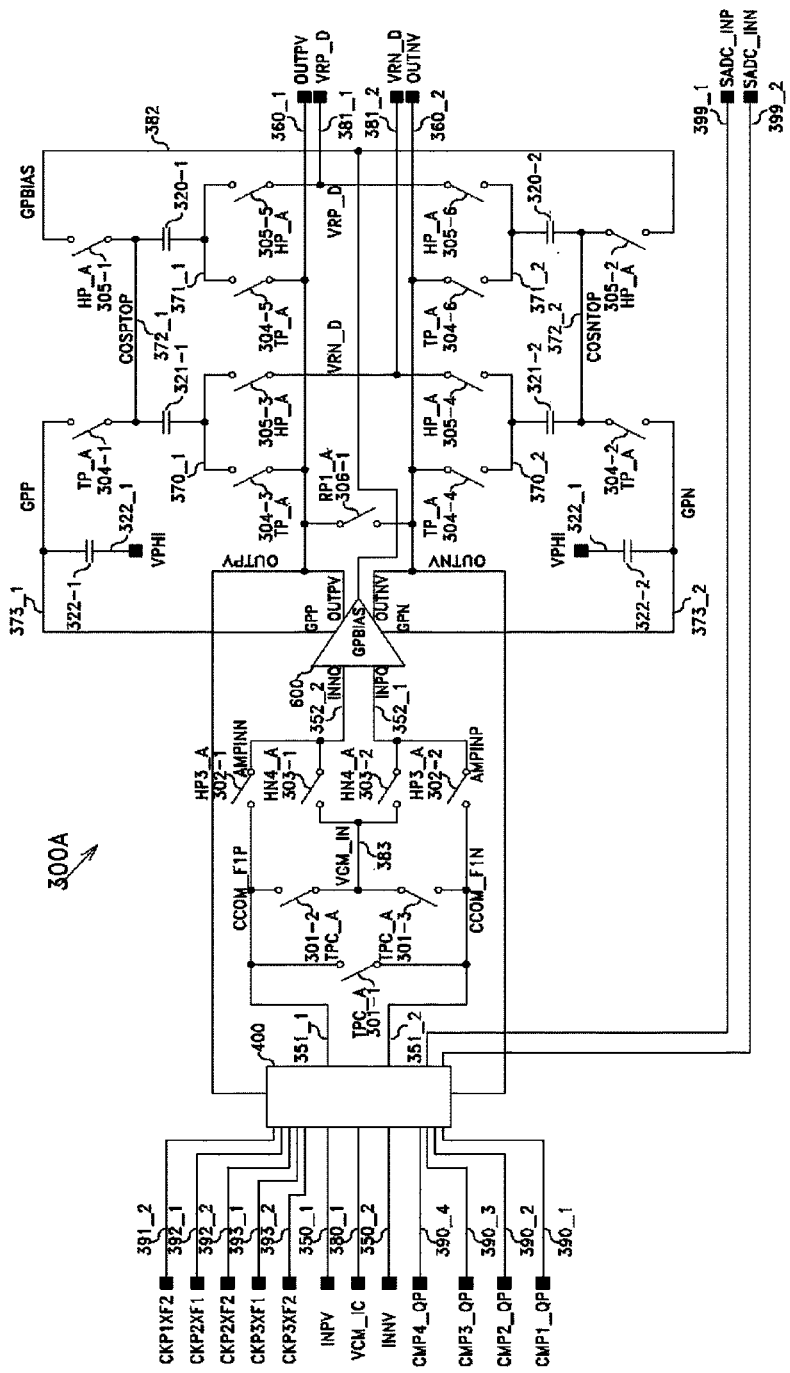
FIG. 3a is an ADC MDAC stage schematic which can be combined with another identical MDAC stage to perform combined track-hold and MDAC functions according to one embodiment.
Figure 4:
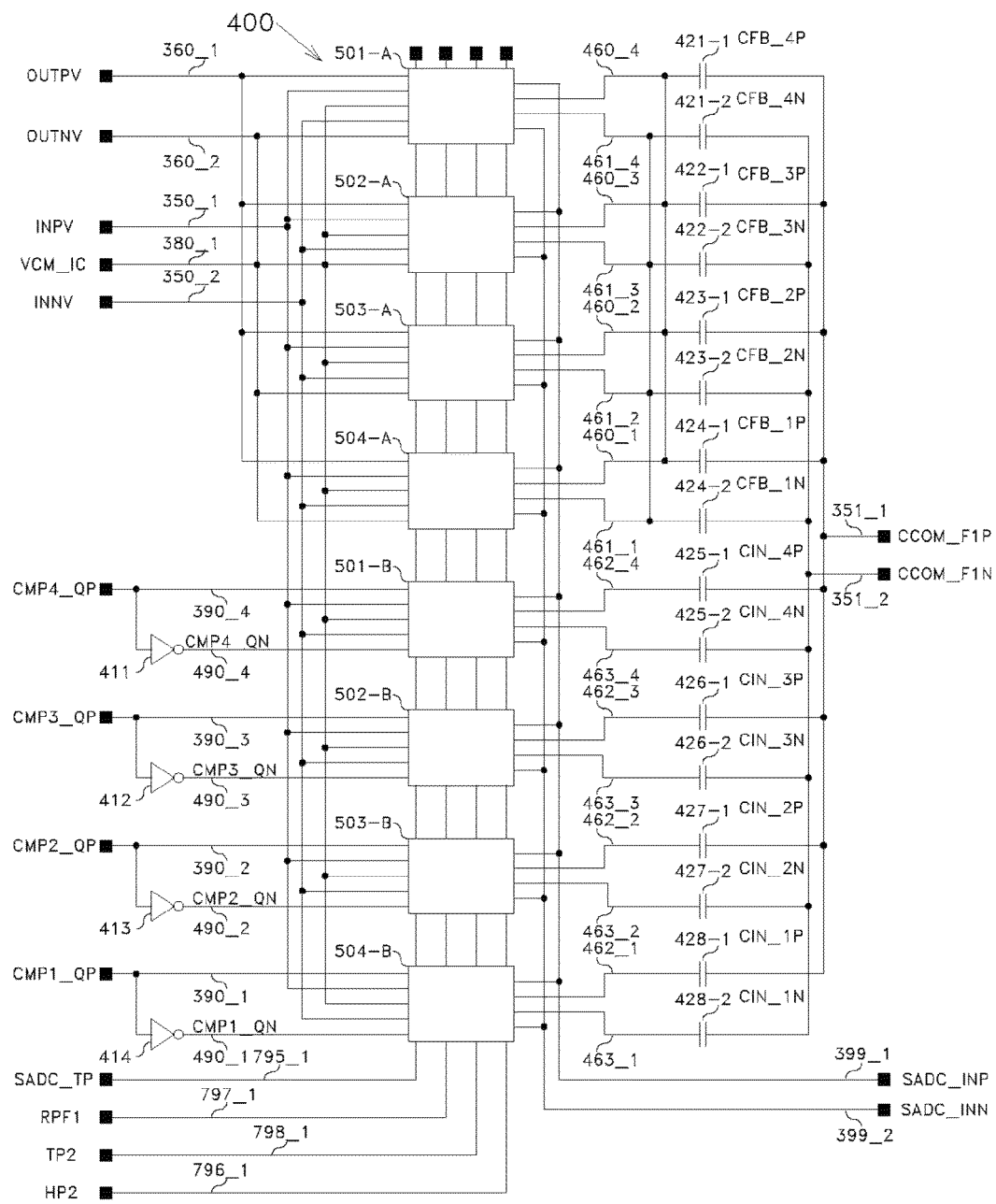
FIG. 4 is a schematic diagram which illustrates the switched-capacitor input block of FIG. 3a including capacitors and switching blocks that sample and hold the input signal and also perform the capacitor DAC function in accordance with one embodiment.
Figure 5A:
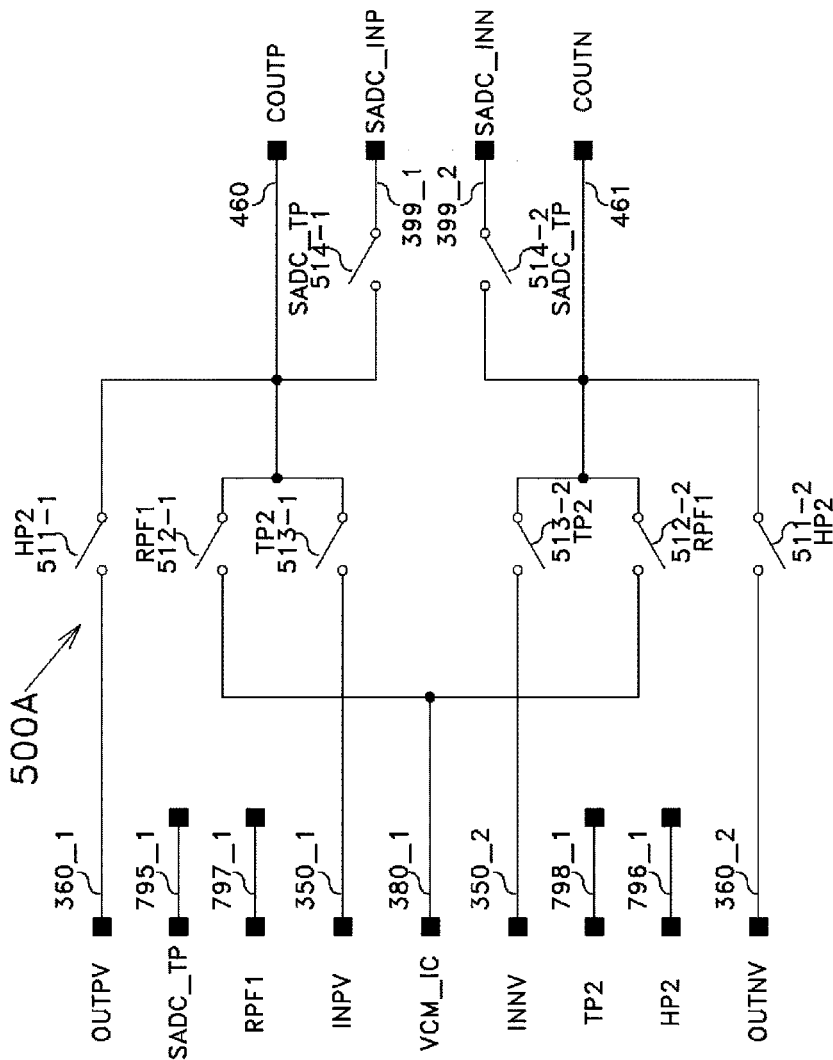
FIG. 5a is a schematic diagram which illustrates the top 4 switching network blocks of FIG. 4 which sample and hold the input signal and also perform the capacitor DAC function in accordance with one embodiment.
Figure 5B:
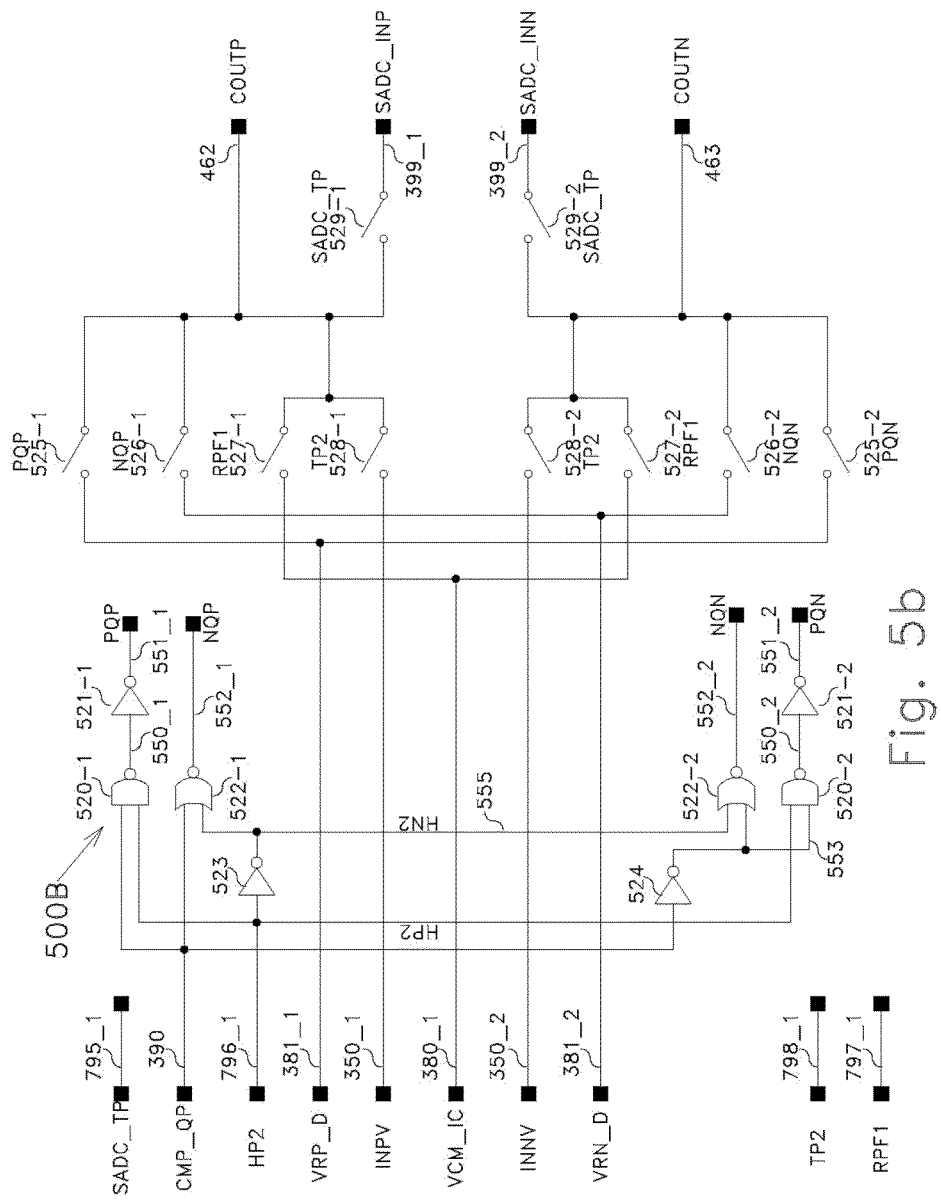
FIG. 5b is a schematic diagram which illustrates the bottom 4 switching network blocks of FIG. 4 which sample and hold the input signal and also perform the capacitor DAC function in accordance with one embodiment.
Figure 7A:
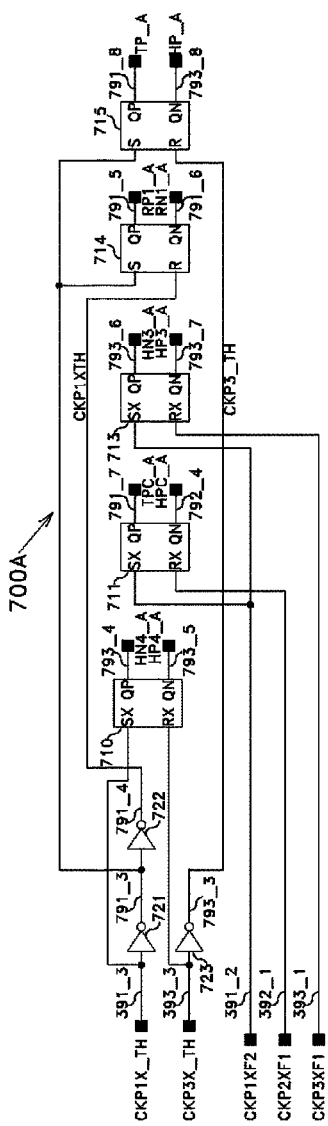
FIG. 7a is a schematic diagram of the logic circuitry which is duplicated, wherein each of the duplicates is used to generate timing signals which control the switches of each of the MDAC stage circuit elements shown in either FIG. 3a, or FIG. 3b, to enable combining MDAC and track-hold functions according to one embodiment.

The blocks 800-1 and 800-2 in FIG. 8 each include identical MDAC circuits shown generally at 300A in FIG. 3a. Each MDAC circuit shown generally at 300A in FIG. 3a is paired with a logic circuit, generally shown at 700A in FIG. 7a. Each of the paired logic circuits of FIG. 7a provides the logic-level timing signals that operate the MDAC switches shown in FIG. 3a, or FIG. 3b. A schematic of the input switched capacitor network block 400 of FIG. 3a is shown in FIG. 4. The schematics for the sub-blocks 501-A to 505-A and 501-B to 505-B of the switching networks shown in FIG. 4 are shown in FIG. 5a and FIG. 5b, respectively. Each switched capacitor network block, shown generally at 400 in FIG. 4, is paired with and operated by the logic circuitry shown generally at 700B in FIG. 7b.

A coarse measurement (quantization) of the amplitude of sampled-and-held inputs of each MDAC block 800-1 and 800-2 is made by a corresponding stage ADC (SADC), 800-3 or 800-4 of FIG. 8. The Q outputs of the SADC flash comparators 890-1A through 890-4A and 890-1B through 890-4B are used to control the capacitor switch selection inputs 390-1 through 390-4 of the corresponding MDACs in a manner well understood by any person of ordinary skill in the art of pipeline ADC design.

Figure 3B:
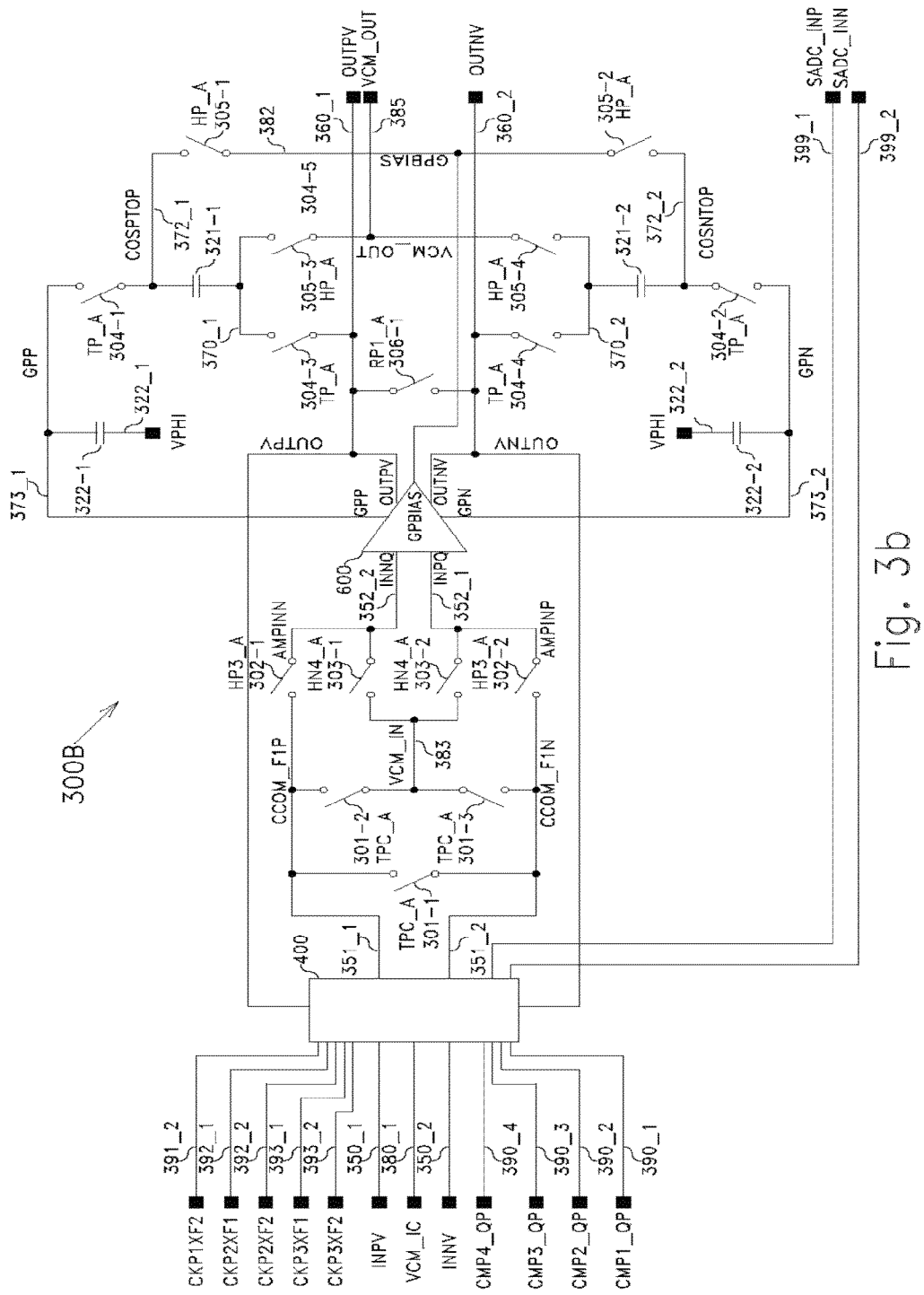
FIG. 3b is an ADC MDAC stage schematic which can be combined with another identical MDAC stage to perform combined track-hold and MDAC functions according to a second embodiment of the MDAC autozero circuit of the present invention
Figure 6:
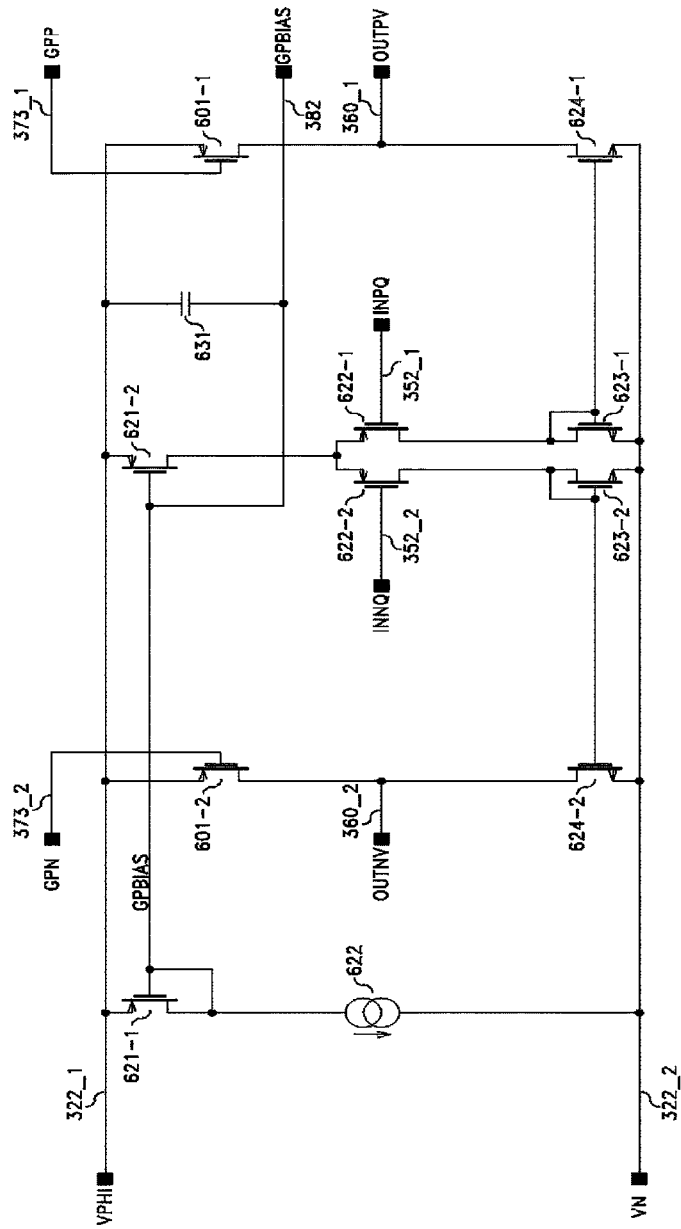
FIG. 6 is a schematic illustration of an operational transconductance amplifier (OTA) using the autozeroing feedback method according to one embodiment.

Each of the MDACs, shown generally at 300A in FIG. 3a, or 300B or in FIG. 3b may include an operational, or residue, amplifier 600 with inputs INPV, INNV and outputs OUTPV, OUTNV which are also shown in the simplified schematic of FIG. 6. While the detailed circuit design of operational amplifiers is well understood by any person of ordinary skill in the art of analog CMOS circuit design, the main purpose of FIG. 6 is to illustrate how the autozero feedback switchcap circuitry of FIG. 3a, or FIG. 3b, which performs amplifier offset and 1/f noise correction, connects to the amplifier output current-control terminals GPP and GPN of the amplifier through wires GPP 373_1 and GPN 373_2, of FIG. 6.

2. Operation of the Residue Amplifier

The residue amplifier shown in FIG. 6 is a well understood configuration commonly known as an operational transconductance amplifier, or OTA. The bias current generator 622 in FIG. 6 establishes the same gate voltage GPBIAS (382) on the current mirror input PMOS 621-1 as in the current mirror output PMOS 621-2. Bypass capacitor 631 reduces voltage changes induced on 382 from internal AC signal feedthrough from signals on the PMOS input differential pair, 622-1 and 622-2, and external switching events. The differential pair current output is amplified by identical NMOS current mirrors 623-1, 624-1 and 623_2, 624_2 which have source terminals connected to the most negative supply terminal VN 322_2. The current source 621-2 and the width/length (W/L) ratios between the diode connected MOS devices 623-1 and 623-2 and the current mirror output devices 624-1 and 624-2 determine the quiescent output current of the NMOS output devices 624-1 and 624-2.

The PMOS output transistors 601-2 and 601-1 sink the currents from NMOS output transistors 624-2-and 624-1. If the gate voltages GPN 373_2 on PMOS transistors 601-2 or GPP 373_1 on PMOS 601-1 go more negative and cause these transistors to sink more current than the quiescent currents from NMOS output transistors 624-2-or 624-1, the outputs OUTNV 360_2 and OUTPV 360_1 will tend to rise in voltage. Conversely if the gate voltages GPN 373_2 or GPP 373_1 go more positive and cause transistors 601-2 or 601-1 to sink less current than the quiescent currents from NMOS output transistors 624-2-or 624-1, the outputs OUTNV or OUTPV will tend to decrease in voltage. Feedback voltage derived from the small capacitors 320-1, 320-2 and 321-1, 321-2 shown in FIG. 3a switched into gate lines GPP 373_1, and GPN 373_2 are therefore capable of controlling the quiescent voltage output of amplifier 600 to achieve a target common mode output voltage and also cancel output voltage offsets. While several alternative operational amplifier 600 circuit configurations are possible and practical, the negative or positive output voltage of an OTA is therefore easily controlled by the bias control voltage inputs GPP or GPN in one embodiment of the invention.

In subsequent sections describing the sequence of timing-control logic waveforms and the operation of the MDAC switched-capacitor timing-control logic it will become apparent that the combination of switches and timing sequences allows the residue amplifier of the first and second ADC first stages to be connected together, input to input, and output to output. Therefore one can assist the other when an amplification function is being performed during the HOLD timing interval, thereby overcoming the Gain-Bandwidth Limitation of each individual amplifier in the separate ADC first stages.

3. Operation of the Timing-Control Logic Flip-Flops

Figure 7B:
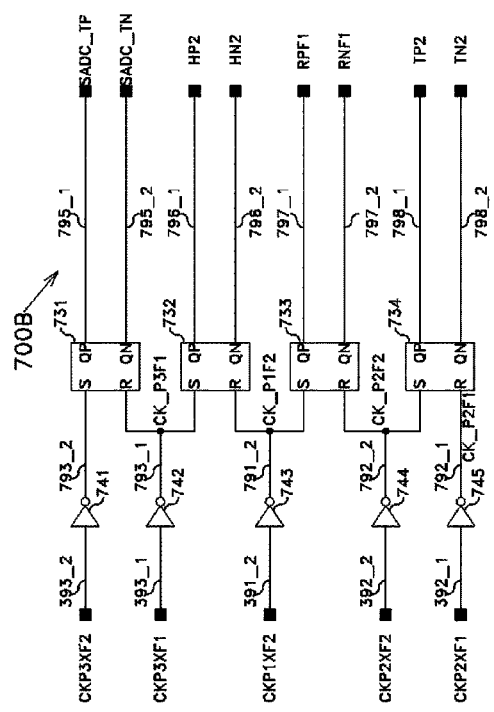
FIG. 7b is a schematic diagram of the logic circuitry which is duplicated, wherein each of the duplicates is used to generate timing signals which control the switches of each of the MDAC switched capacitor input elements shown in FIG. 4 to enable combining MDAC and track-hold functions according to one embodiment.

The operation of the MDAC block, shown generally at 300A in FIG. 3a or at 300B in FIG. 3b, and the switch capacitor block, shown generally at 400 in FIG. 4, depends on the timing of locally generated logic signals, such as 798_1 and 793_7 which are generated by the timing-control logic of FIGS. 7a and 7b, and also shown in FIG. 9 with appropriate timing delays between the blocks 800-1 and 800-2. Therefore, the detailed description of the one embodiment continues with a description of the switchcap timing-control logic flip-flops (FF, or flops).

The set-reset SR flip flops used in one embodiment are designed to produce a positive logic-level output from the QP output (for example output 791_5 of flop 714 in FIG. 7a) and a negative logic-level output from the QN output when the set input, S 791_3, receives a positive (or 1) logic level input. Conversely, they produce a negative logic-level output from the QP output and a positive logic-level output from the QN output when the reset input, R 791_4, receives a positive logic level input. For the SRX flip-flops with inputs designated SX and RX, the QP output changes state to a 1, and the QN output changes to a 0 when the set input SX (for example input 391_2 of flop 711 in FIG. 7a) receives a negative (or 0) logic-level input.

The SR-FF flip-flops in FIGS. 7a and 7b, and all others in the illustrated embodiments of the invention are designed in a manner well understood to produce non-overlapping (NOL) QP and QN outputs. In other words, both QP and QN outputs will neither be positive at the same time nor negative at the same time. As is also well understood, it is desirable that the non-overlap time periods are as short as possible so that the delay from receiving a control input change to producing a change in both outputs is minimized. Typically, a non-overlap time of less than 5% of the total clock period is desired. Therefore the waveforms of FIG. 9 are represented graphically in rectangular form, with the understanding that they are to be generated using non-overlapping-output SR flip-flop design (NOL-SR-FF) or, if negations inputs SX and RX are used, then a NOL-SRX-FF design.

It is also well understood that the NOL-SR-FF design must produce output voltage level changes that are sufficient to drive the analog CMOS switches. When both N and P type CMOS devices are used for the switches, then both QP and QN voltage outputs are used. However, for purposes of clarity, it should be assumed that when a switch control voltage, such as control voltage TPC_A of switch 301-1 in FIG. 3a is positive (logic 1), then the switch is closed (inputs and outputs are connected together). According to principles well understood by any person of ordinary skill in the art of analog CMOS circuit design, when both the QP and QN voltage levels are required to be higher than the logic supply voltage, output-voltage level-shifters must be used within the flip-flop to produce a higher voltage at the flip-flop outputs.

4. Operation of the MDAC Switched-Capacitor Timing-Control Logic

The switches of MDAC switched-capacitor circuit in block 800-1, 800-2, and shown in the schematic diagram of FIG. 3a or 3b are each operated by identical timing-control logic circuits which are shown generally at 700A in FIG. 7a. The operation of the flops in FIG. 7a, their connection to control a corresponding switch in FIG. 3a or 3b, and the timing of that switch control signal for each of blocks 800-1 and 800-2 is shown in FIG. 9. It should be understood that all the timing control logic signals described as operating the circuitry in FIG. 3a are also capable of operating the circuitry in FIG. 3b if that alternate embodiment of the MDAC is used. The descriptions in the following paragraphs begin by referencing the input signal connections shown in FIG. 7a, such as CKP1X_TH 391_3 and CKP1XF2 391_2.

The negative-going logic input signal CKP1X_TH 391_3 causes the QP output of each NOL-SRX-FF 710 in blocks 800-1 or 800-2 to produce a logic 1 output HN4_A on wire 793_4 and a logic 0 output HP4_A on wire 793_5. The HN4_A logic signal is shown in the timing diagram of FIG. 9 as the logic signals in block 800-1 and 800-2 using the designation "HN4A 793_4 in 800-1" or "HN4A 793_4 in 800-2." The HN4_A logic 1 output on wire 793_4 causes amplifier reset switches 303-1 and 303-2 in FIG. 3a to close, connecting the amplifier inputs INNQ 352_2 and INPQ 352_1 to the amplifier input common voltage VCM_IN, 383. VCM_IN is derived from an external reference voltage source such as 100 mV above the zero-voltage reference, or most negative supply terminal, which is also designated by VN 322_2 in FIG. 6. A negative-going logic input signal CKP3X_TH (391_3) causes the QP output of each NOL-SRX-FF 710 in blocks 800-1 or 800-2 to produce a logic 0 output on HN4_A 793_4 and open switches 303-1 and 303-2. The HN4_A logic signal occurs in synchronism with the ADC SAMPLE CLK 900_2 "track" timing interval shown in FIG. 9.

The negative-going logic input signal CKP1X_TH 391_3 also causes the output of inverter 721 at 791_3 to go to a logic 1 and cause the QP output of NOL-SR-FF 715 in blocks 800-1 or 800-2 to produce a logic 1 output on TP_A 791_8. NOL-SR-FF 715 is reset (QP output goes to 0 and QN goes to 1) when a negative-going logic input signal CKP3X_TH 393_3 causes the output of inverter 723 at 793_3 to go to a logic 1. It can be seen from FIG. 9 that the negative transitions of CKP1X_TH and CKP3X_TH occurs in synchronism with the edges of ADC SAMPLE CLK 900_2, therefore, the timing of the QP output of 715 also occurs in synchronism with the ADC SAMPLE CLK 900_2 "track" timing interval of FIG. 9, and no separate timing waveform need be shown for TP_A 791_8. It should also be noted with reference to FIG. 3a that TP_A 791_8 controls switches 305-1, 305-2, 305-3, 305-4, 305-5, 305-6 in blocks 800-1 and 800-2 to connect one plate of the small autozero capacitors 320-1, 320-2 and 321-1, 321-2 to amplifier 600 outputs and the other plate to amplifier output biasing connections GPP 373_1 or GPN 373_2 during the ADC SAMPLE CLK 900_2 "track" timing interval. Because the HP_A 793_8 timing signals are derived from the flop QN output, they are just the logical complement of the QP output and therefore are in synchronism with the ADC SAMPLE CLK 900_2 "hold" timing interval. During hold, switches 305-1, 305-2, 305-3, 305-4, 305-5, 305-6 for blocks 800-1 and 800-2 will open and switches 305-1, 305-2, 305-3, 305-4, 305-5, 305-6 for blocks 800-1 and 800-2 will close, to connect one plate of the small autozero capacitors 320-1, 320-2 and 321-1, 321-2 to MDAC positive and negative voltage references VRP_D 381_1 and VRN_D 381_2 and the other plate to the amplifier gate bias voltage GPBIAS.

The negative-going logic input signal CKP1X_TH 391_3 also causes the output of inverter 721 at 791_3 to go to a logic 1 and cause the QP output of NOL-SR-FF 714 to produce a logic 1 output on RP1_A 791_5 and a logic 0 on RN1_A 791_6. RP1_A 791_5 controls switch 306-1 in FIG. 3a to clamp both of OTA 600 outputs together. Because CKP1XTH 791_4 is directly connected to the R input of NOL-SR-FF 714, the flop is reset when CKP1X_TH 391_3 goes to 1 and therefore produces a logic 1 at the output of inverter 722. In FIG. 9 the timing of RP1_A 791_5 is shown as RP1_A 791_5 for both blocks 800-1 and 800-2. A logic 1 on RP1_A 791_5 controls amplifier reset switch 306-1 in FIG. 3a to short the outputs of amplifier 600 together during the first half of the ADC SAMPLE CLK 900_2 "track" timing interval.

The negative-going logic input signal CKP1XF2 391_2 causes the QP output of each NOL-SRX-FF 711 in blocks 800-1 or 800-2 to produce the logic 1 output TPC_A on wire 791_7 and a logic 0 output HPC_A on wire 792_4. The timing for the 2 different TPC_A logic signals is shown in the timing diagram of FIG. 9 as the logic signals in block 800-1 and 800-2 using the designation "TPC_A 791_7 in 800-1" or "TPC_A 791_7 in 800-2." When the timing of the same logic signal is different for blocks 800-1, and 800-2 as shown in the timing diagram of FIG. 9, the reason for the difference can therefore be determined for CKP1XF2 391_2 and the remaining logic signals by referring to the description of the block timing signal interconnections of FIG. 8 in "Section 1—Interconnection of the Major Blocks." The TPC_A logic 1 output on wire 791_7 causes the input capacitor reset switches 301-1, 301-2, 301-3 in FIG. 3a to close, connecting each capacitor 421 through 428 positive and negative signal output plates (CCOM_F1P 351_1 and CCOM_F1N 351_2) in the input switched-capacitor network of FIG. 4 to be connected together and also to the amplifier input common voltage VCM_IN 383. A negative-going logic input signal CKP2XF1 392_1 causes the QP output of NOL-SRX-FF 711 to produce a logic 0 output on wire 791_7 and open switches 301-1, 301-2, 301-3 at the appropriate times for the different blocks 800-1 and 800-2.

The negative-going logic input signal CKP3XF1 393_1 causes the QN output of NOL-SRX-FF 713 to produce a logic 1 output HP3_A on wire 793_7 and also causes the QP output to produce a logic 0 output HN3_A on wire 793_6. The 2 different HP3_A logic signals for blocks 800-1 and 800-2 are shown in the timing diagram of FIG. 9 as the logic signals in using the designation "HP3_A 791_7 in 800-1" or "HP3_A 791_7 in 800-2." The HP3_A logic 1 output on wire 793_7 causes the amplifier input connection switches 302-1 and 302-2 to connect to the capacitor 421 through 428 positive and negative signal output plates (CCOM_F1P 351_1 and CCOM_F1N 351_2) in the input switched-capacitor network of FIG. 4 to the operational amplifier 600 negative and positive inputs INNQ 352_2 and INPQ 352_1. These switches are opened when the negative-going logic input signal CKP1XF2 391_2 causes the QN output of each NOL-SRX-FF 713 to produce a logic 0 on output HP3_A (793_7).

5. Operation of the Input Switched-Capacitor Timing-Control Logic

When CKP2XF2 392_2 in FIG. 7b. transitions to a logic 0, the positive-going output of inverter 744 (792_2) also causes the QP output of NOL-SR-FF 734 to produce a logic 1 and the QN output to produce a logic 0. The QN output TN2 798_2 is not connected. The OP output logic 1 signal TP2 798_1 begins the MDAC tracking interval. TP2 798_1 is shown in FIG. 4 to connect to blocks 501-A through 505-B where it closes switches 513-1 and 513-2 in FIG. 5a, and switches 528-1 and 528-2 in FIG. 5b connecting the positive and negative voltage inputs INPV 350_1 and INNV 350_2 to the input plates of capacitors 421-1 through 428-2 in FIG. 4. The timing of signal TP2 798_1 for the blocks 800-1 and 800-2 is shown in FIG. 9. When CKP2XF1 392_1 in FIG. 7b transitions to a logic 0, the positive-going output of inverter 745 (792_1) also causes the QP output of each NOL-SR-FF 734 in blocks 800-1 or 800-2 to produce a logic 0 and the QN output to produce a logic 1. This causes the TP2 (798_1) output to go to a logic 0. The TP2 logic 0 opens switches 513-1 and 513-2 in FIG. 5a, and switches 528-1 and 528-2 in FIG. 5b disconnecting the positive and negative voltage inputs INPV (350_1) and INNV (350_2), respectively, from the input plates of capacitors 421-1 through 428-2 in FIG. 4 and ending the MDAC TRACK interval.

Again, with reference to FIG. 7b, the negative-going logic input signal CKP3XF2 393_2) causes the output of inverter 741 output at 793_2 to go to a logic 1 and cause the QP output of NOL-SR-FF 731 to produce a logic 1 output on SADC_TP (795_1) and the QN output to produce a logic 0. The QN output SADC_TN 795_2 is not connected. SADC_TP (795_1) is shown in FIG. 4 to connect to blocks 501-A through 505-B where it closes switches 514-1 and 514-2 in FIG. 5a, and switches 529-1 and 529-2 in FIG. 5b. This connects the input plates of capacitors 421-1 through 428-2 in FIG. 4 on wires SADC_INP 399_1 and SADC_INN 399_2 in FIGS. 5a and 5b to the stage ADC (SADC) block 800-3 from MDAC block 800-1 SADC_INP and SADC_INN on wires 399_1A and 399_2A, and to the stage ADC (SADC) block 800-4 from MDAC block 800-2 SADC_INP and SADC_INN on wires 399_1B and 399_2B as shown in FIG. 8. The 2 different SADC_TP switch control signal waveforms for each block are shown in FIG. 9. The negative-going logic input signal CKP3XF1 393_1 causes the output of inverter 742 output at 793_1 to go to a logic 1 and cause the QP output of NOL-SR-FF 731 to produce a logic 0 output on SADC_TP (795_1) which opens switches 514-1 and 514-2 in FIG. 5a, and switches 529-1 and 529-2 in FIG. 5b, disconnecting the capacitors from the inputs of the SADC, thereby ending the tracking time interval of the stage. From the timing diagram of FIG. 9 note that the TP2 logic 0 which opens up the connection from the capacitor input plates to the INPV and INNV voltage inputs occurs one-quarter of an ADC SAMPLE CLK period prior to the time when the SADC_TP logic 0 which opens up the connection from the capacitor plates to the voltage inputs in each of the blocks 800-1 and 800-2. Therefore the voltage across the capacitor input plates remains stable for that quarter ADC SAMPLE CLK period time difference. This time period of comparator input voltage stability greatly reduces the requirement for the amplifier and comparator input circuit bandwidths to be precisely matched.

The logic 1 output of inverter 742 on 793_1 also causes the QP output of NOL-SR-FF 732 to produce a QP logic 1 output and the QN output to produce a logic 0. The QN output HN2 796_2 is not connected. The QP logic 1 output on HP2 (796_1) begins the HOLD time interval of the stage. HP2 796_1 is shown in FIG. 4 to connect to blocks 501-A through 505-B where it closes switches 511-1 and 511-2 in FIG. 5a connecting the positive and negative input plates of capacitors 421-1 through 424-2 to the positive and negative amplifier outputs OUTPV 360_1 and OUTPN 360_2 in FIG. 5a. The 2 different HP2 switch control signal waveforms for blocks 800-1 and 800-2 are shown in FIG. 9. When the negative-going logic input signal CKP1XF2 391_2 causes the output of inverter 743 output at 791_2 to go to a logic 1, the QP output of each NOL-SR-FF 732 in blocks 800-1 or 800-2 transition to a logic 0, disconnecting the capacitors from the amplifier 600 outputs OUTPV and OUTPN, ending the hold time interval of the stage.

The HP2 796_1 signal is also shown in FIG. 5b connecting to logic inverter 523 having output HN2 555. Referring to FIG. 5b, if the one of the appropriate stage SADC comparator Q outputs that is connected to the input CMP_QP 390 is a logic 1 during the time HP2 796_1 is a logic 1, then NAND gate 520-1 will output a logic 0 on line 550_1 to inverter 521-1 resulting in a logic 1 on switch control line PQP 551_1 which will close switch 525-1 connecting the COUTP capacitor input plate wire 462 to the positive analog voltage reference VRP_D 381_1. Because the CMP_QP input is a logic 1, the output of the NOR gate 522-1 must produce a logic zero on control line NQP 552_1 and therefore switch 526-1 will not connect COUTP to the negative analog voltage reference VRN_D 381_2. However, the logic 1 output of CMP_QP will produce a logic 0 at the output of inverter 524 on wire 553, and that output combined with the logic 0 from inverter 523 will result in a logic 1 on switch control line NQN 552_2 from NOR gate 522-2. NQN will cause switch 526-2 to close, connecting the COUTN capacitor input plate wire 463 to the negative analog voltage reference VRN_D 381_2 during time interval HP2 is a 1 in blocks 800-1 and 800-2 as shown in FIG. 9. The logic 0 at the output of inverter 524 on wire 553 will force the output of NAND 520-2 to be a logic 1, thereby forcing inverter 521-2 to output a logic 0 on switch control line PQN 550_2. A logic 0 on PQN will cause switch 525-2 to open, not allowing the COUTN capacitor input plate wire 463 to connect to the negative analog voltage reference VRN_D (381_2).

Conversely, if the one of the stage SADC comparator Q outputs that is connected to the block positive input CMP_QP 390 is a logic 0 during the time a logic 1 from HP2 796_1 causes the output of inverter 523 to also be a logic 0, then output of the NOR gate 522-1 will produce a logic 1 on switch control line NQP 552_1 and therefore switch 526-1 will connect COUTP to the negative analog voltage reference VRN_D 381_2 during time interval HP2 is a 1 in blocks 800-1 and 800-2 as shown in FIG. 9. However, because the CMP_QP input is a logic 0, the output of the NAND gate 520-1 must be a logic 1, causing inverter 521-1 to produce a logic 0 on control line PQP 552_1 and therefore switch 525-1 will not connect COUTP 462 to the positive analog voltage reference VRP_D 381_1. The logic 0 output of CMP_QP will insure a logic 1 at the output of inverter 524, and that output, together with the logic 1 on HP2 will result in a logic 0 at the output of NAND gate 520-2 on 550_2 and a logic 1 on switch control line PQN 551_2. Therefore switch 525-2 will connect COUTN to the positive analog voltage reference VRP_D (381_1). The logic 1 at the output of inverter 524 will force the output of NOR gate 522-2 to output a 0 on switch control line NQN. A logic zero on switch control line NQN will open switch 526-2, disconnecting COUTN from the negative analog voltage reference VRN_D 381_2.

At the end of the hold timing interval for each MDAC, when CKP1XF2 goes to logic zero, HP2 goes to zero. At that time, the PQP, NQP, PQN, and PQN logic outputs are all forced to logic 0, which also forces switches 525-1, 525-2 and 526-1, 526-2 to open regardless of the logic state of CMP_QP. As HP2 goes to 0 in response to the negative-going transition of CKP1XF2, the positive-going output of inverter 743 791_2 also causes the QP output of NOL-SR-FF 733 to produce a logic 1 output signal RPF1 797_1. RFP1 797_1, as shown in FIG. 4, connects to blocks 501-A through 505-B where it closes switches 512-1 and 512-2 in FIG. 5a and switches 527-1 and 527-2 in FIG. 5b connecting the positive and negative input plates of capacitors 421-1 through 424-2 to the ADC common mode input voltage reference VCM_IC 380_1. It is well understood that the ADC common mode input voltage VCM_IC and opamp 600 common mode output voltage are commonly set to a voltage midway between the MDAC positive reference voltage VRP_D 381_1 and the MDAC negative reference voltage VRN_D (381_2), and that these voltage references are set to values equal to the positive and negative limits of the analog input and output voltage swings for the pipeline ADC stages. The negative-going logic input signal CKP2XF2 392_2 causes the output of inverter 744 output at 792_2 to go to a logic 1 and cause the QP output of each NOL-SR-FF 733 in blocks 800-1 or 800-2 to produce a logic 0 output on RFP1 797_1) which, in turn, causes switches 512-1 and 512-2 in FIGS. 5a and 527-1 and 527-2 in FIG. 5b to open, ending the input capacitor reset timing interval.

The timing of signal RPF1 (797_1) for the blocks 800-1 and 800-2 is shown in FIG. 9. During the time RPF1 is a logic 1, any residual charge on the input capacitors is cleared. Again, with reference to FIG. 9, the RPF1 timing interval of one-quarter of a full ADC SAMPLE CLK period, is substantially longer than the short "clearing pulse" (PHI_CLEAR) timing interval of the referenced prior art which consumed a portion of the TRACK half-clock interval. It can also be seen from the timing diagram of FIG. 9, that the RPF1 timing interval does not subtract from the TP2 tracking time interval, which at a width of a full ADC SAMPLE CLK period is more than twice the timing interval of the referenced prior art TRACK less-than half-clock interval.

6. Operation of the MDAC and Input Switched-Capacitor Circuits

The description of the MDAC and input switched-capacitor circuit operation begins with the reset of the input capacitor array of block 800-1 as shown in FIG. 4. The purpose of the reset time interval is to initialize the voltage across the capacitors 421-1 through 428-2 so that any residual voltage remaining as a result of the pervious conversion will be removed. The substantially-complete removal of the residual voltage is particularly relevant in pipeline ADC systems which employ a plurality of pipeline ADCs, also known as pipeline ADC leaves, to perform analog-to-digital conversions in a multi-leaf ADC system at a higher rate than a single leaf. The reason for the relevancy in this case is that the previous signal stored on the sampling capacitors of a particular leaf in a multi-leaf system is not the previous analog input voltage sample of that leaf, but a voltage sample from a prior time interval which may have a value that is not linearly related to the present sample.

Immediately prior to the MDAC TRACK interval, the reset signal RPF1 797_1 in 800-1, causes the reset switches 512-1, 512-2 and 527-1, 527-2 in blocks 501-A through 505-B to connect the input plates of capacitors 421-1 through 428-2 to be connected to VCM_IC, the ADC input signal common mode reference voltage. During the reset signal RPF1 time interval, 797_1 in 800-1 as shown in FIG. 9, it is also necessary to connect the output plates of the capacitors to an appropriate reference voltage. This connection is made during timing interval TPC_A 791_7 in 800-1 as shown in FIG. 9, by switches 301-1, 301-2, and 301-3 in FIG. 3a, which connect the output plates to the ADC amplifier input common mode reference VCM_IN 383. Note that the long reset time interval, or the one-quarter-ADC SAMPLE CLK period for reset is long in comparison to the prior art the "substantially-shorter-than half-clock" timing allocation for the clearing pulse according to Devarajan. The longer reset time interval allows a smaller reset, or clearing, switch to be used to produce the same result. The one embodiment therefore overcomes the prior art limitation previously described as the Clearing Switch Size Limitation.

Referring again to FIG. 9, TP2 798_1 in 800-1 becomes logic 1 at the beginning of the logic 1 to 0 transition for RPF1 797_1 in 800-1 (end of reset) and extends for a full ADC SAMPLE CLK 990_2 period beyond that transition. This begins the TRACK time interval for block 800-1 in one embodiment of the invention. Note that the TP2 TRACK time interval begins more than a full clock period before the hold time interval for a conventional pipeline ADC shown for the ADC SAMPLE CLK 990_2. During the time interval after the reset signal RPF1 (797_1) in 800-1 returns to a logic 0, the reset switches 512-1, 512-2 and 527-1, 527-2 in blocks 501-A through 505-B open and the tracking switches 513-1, 513-2 and 528-1, 528-2 in blocks 501-A through 505-B close, to connect the input plates of capacitors 421-1 through 428-2 to connect to INPV 350_1 and INNV 350_2, the ADC positive and negative input voltage signals. These tracking switches are closed for a TP2 period of time equal to one full ADC SAMPLE CLK 990_2 period.

Because the capacitor output plates are connected to the ADC amplifier input reference voltage VCM_IN throughout this same period of time TPC_A by switches 301-1, 301-2, and 301-3 in FIG. 3a, the tracking capacitors 421-1 through 428-2 have approximately twice as much time to track the input signal as typical pipeline ADCs of the prior art, such as the ADC disclosed in the Rezayee reference (FIG. 2b) which allocate only half of the ADC SAMPLE CLK period for input signal voltage tracking. It should be also noted that the extra factor of 2 time allocation for input buffer amplifier (BAMP) slewing and settling is also an advantage. That is because it is well known that a high ratio of slewing to settling time in a sample and hold circuit increases nonlinearity when acquiring high-amplitude input signals. As previously noted, the ADC voltage input signal tracking time which is approximately equal to the ADC SAMPLE CLK period in one embodiment has a time advantage of more than a factor of two in comparison to the tracking time interval in the SHA-less pipeline ADC disclosed in the Devarajan which must be shortened to less than one half of the ADC SAMPLE CLK period in order to allow time for the reset or "clearing" pulse to occur. The one embodiment therefore overcomes the prior art limitation previously described as the Shortened Tracking Time Limitation.

While the preceding and following descriptions of the operation of one embodiment emphasize the operation of MDAC block 800-1 and SADC block 800-3, it should be understood that the operation of MDAC block 800-2 and SADC block 800-4 is identical, however delayed in time by one full ADC SAMPLE CLK 990_2 as shown in FIG. 9. It should be noted that if more than one input capacitor network, for example capacitors 421-1 through 428-2 in block 800-1, is connected to the ADC positive and negative voltage inputs INPV 350_1 and INNV 350_2 at one time, the capacitive load on the ADC input device, such as an external input buffer amplifier BAMP, will double for a certain period of time. Doubling the capacitive load would slow the time response of the BAMP and is therefore would be an undesirable property of the ADC. Note that because TP2 798 in 800-2 becomes logic 1 at the beginning of the logic 1 to 0 transition for TP2 798 in 800-1 and transitions to logic 0 at the beginning of the 0 to 1 transition of TP2 798 in 800-1, the times for the input capacitor networks 800-1 and 800-2 to be connected to the ADC analog input voltage do not overlap. Therefore the ADC input capacitor network load on the ADC input device, such as an input BAMP will remain substantially constant, except for the very brief timing interval where the 2 different TP2 timing signals are transitioning from 0 to 1, and 1 to 0. The one embodiment therefore overcomes the prior art limitation previously described as the ADC Input Capacitive Load Variation Limitation.

After the 1 to 0 transition of TP2 798 in 800-1, the input capacitors are disconnected from the input voltage signal. Referring to the timing diagram of FIG. 9, it is evident that a time interval equal to one-quarter of the ADC SAMPLE CLK period elapses before the HP2 HOLD signal switchably connects the input plates of capacitors 421-1 to 424-2 are to the amplifier positive and negative outputs OUTPV 360_1 and OUTNV 360_2 by switches 511-1, 511-2 as shown in FIG. 5a. Also, a time interval equal to one-quarter of the ADC SAMPLE CLK period elapses before the input plates of capacitors 425-1 to 425-2 are switched during HP2 (796_1 in 800-1) to either the MDAC positive or negative voltage reference outputs VRP_D 381_1 or VRN_D 381_2 by switches 525-1 or 525-2, and 526-1 or 526-2, shown in FIG. 5a. The capacitor input plates in block 800-1 are connected to the appropriate SADC comparator inputs on wires 399_1A, 399_2A shown in FIG. 8, during the time that the timing signal SADC_TP (795 in 800-1) is a logic 1, as shown in FIG. 9. SADC_TP transitions to a logic 1 and maintains the connection between the capacitor input plates and the SADC inputs during the one-quarter ADC SAMPLE CLK period after the 1 to 0 transition of TP2.

While the SADC comparator-input sample of the ADC input signal is slightly disturbed by the opening of the ADC sampling switches 514_1, 514_2 and 529_1, 529_2, at the 1 to 0 transition of TP2, the sampling error is not significant because the sampled signal is held at a substantially constant value as a result of the parasitic capacitance to ground of the input capacitors 421-1 through 428-2. SADC_TP remains a logic 1 for one-quarter of an ADC SAMPLE CLK period, until the 0 to 1 transition of HP2, when the capacitor input plate voltages are reconnected to the ADC input voltage reference VCM_IC by switch control signal RPF1. The one-quarter ADC SAMPLE CLK period between the opening of the switches connecting the comparator inputs to the ADC analog voltage inputs, and the 0 to 1 transition of HP2, allows ample time for the SADC comparator input circuits to acquire, and hold, the sampled value of a rapidly changing input signal, that is approximately the same as the sampled value acquired by the MDAC, without having to closely match the response to the amplifier input time response. Because one embodiment allows ample time for the comparator circuits to acquire the same sampled-and-held value of a rapidly changing input signal that is held by the MDAC track-and-hold circuitry, it therefore overcomes the prior art limitation previously described as the SADC-BAMP Bandwidth Matching Limitation.

The one-quarter ADC SAMPLE CLK period allowed for comparator regeneration also allows time to regenerate and produce a correct logical output with an extremely low error rate. That is because the comparator regeneration time constant, which was previously described to be in the range of 50 ps for 180 nm CMOS technology, will easily be in the range of 5 picoseconds for 28 nm CMOS technology. For a 1 GSPS ADC SAMPLE CLK rate, a one-quarter ADC SMAPLE CLK period of 250 pS would still allow comparator regeneration for more than 35 regeneration time constants. Because one embodiment overcomes the prior art limitation shortening the time available for the TRACK timing interval it overcomes the problem of high metastability error rates in low error-rate telecommunication systems which was previously described as the Comparator Delay-Time Limitation.

As described previously, the 0 to 1 transition of HP2 (796_1 in 800-1), causes the residue amplifier 600 positive and negative outputs OUTPV and OUTNV to be connected to the positive and negative capacitor 421-1 to 424-2 input plates and the appropriate comparator outputs to control the connection of the positive and negative capacitor 425-1 to 428-2 input plates to the appropriate MDAC positive or negative voltage reference outputs VRP_D or VRN_D. The residue amplifier then has a one-half ADC SAMPLE CLK period (a timing interval designated hold in waveform 990_2 in FIG. 9) to settle and transmit the residue amplifier output to the next stage of the ADC.

7. Operation of the Amplifier DC Offset and 1/f Noise Correction Circuits

The operation of the offset and 1/f noise correction circuits is described with reference to FIG. 3a. The timing of the control signal for the switches which enable offset and 1/f noise correction is the same for both block 800-1 and 800-2. Summarizing the timing analysis of section 3, the control signals TP_A 791_8 and HN4_A 793_4 operate in synchronism with the ADC SAMPLE CLK 900_2 "track" timing interval of FIG. 9. Also, the control signal HP_A (793_8) operates in synchronism with the ADC SAMPLE CLK 900_2 "hold" timing interval shown in FIG. 9. The reset signals RP1_A (791_5 in 800-1) and RP1_A (791_5 in 800-2) also operate in synchronism with the ADC SAMPLE CLK 900_2 "track" timing interval shown in FIG. 9, but are only a logic 1 for the first one-half of the "track" timing interval.

During the track timing interval, the amplifier 600 inputs INNQ and INPQ are connected by switches 303-1 and 303-2 to the amplifier input voltage reference VCM_IN 383, thereby causing the amplifier output voltage difference VOUTP-VOUTN to go toward zero. During the first half of the track timing interval, control timing signal RP1_A closes the reset switch 306-1 which helps force the VOUTP-VOUTN difference to go more rapidly toward zero. At the end of the reset signal RP1_A, the outputs are released during the last half of the track timing interval to settle to a residual voltage difference which is the result of an input DC offset voltage difference and input 1/f noise.

In order for the small output offset voltage OUTPV-OUTNV difference to create an accurate GPP-GPN voltage difference, the small autozero capacitors must be first precharged to an initial voltage which is the same for both positive and negative amplifier outputs. If the capacitors are precharged to a reference voltage difference that is equal to the difference between the target GPP and GPN quiescent DC bias voltage GPBIAS on line 382 in amplifier 600, and the target amplifier common mode output voltage VCM_OUT, then the amplifier switched-capacitor feedback circuit will also be capable of correcting for errors in amplifier common-mode voltage. During the hold timing interval of the ADC SAMPLE CLK (990_2) in both block 800-1 and 800-2 one plate, COSPTOP (372_1), of the small autozero capacitors 321-1 and 320-1 is connected by switch 305-1 to the target GPP and GPN quiescent DC bias voltage GPBIAS (382), while the other plates 370_1 and 371_1 are connected to VRN_D by switch 305-3 for capacitor 321-1 and to VRP_D by switch 305-5 for capacitor 320-1. During the same hold time interval, COSNTOP (372_2) of the small autozero capacitors 321-2 and 320-2 is connected by switch 305-2 to the target GPP and GPN quiescent DC bias voltage, GPBIAS 382, while the other plates 370_2 and 371_2 are connected to VRN_D by switch 305-4 for capacitor 321-2 and to VRP_D by switch 305-6 for capacitor 320-2.

During the entire track time interval, one plate of the small autozero capacitors 321-1 and 320-1 are connected by switches 305-3 and 305-5 to the amplifier positive output OUTPV, while the other plate is connected by switch 305-1 to the amplifier GPP bias input 373_1. Also during the entire track time interval, one plate of the small autozero capacitors 321-2 and 320-2 are connected by switches 305-4 and 305-6 to the amplifier negative output OUTNV, while the other plate is connected by switch 305-2 to the amplifier GPN bias input 373_2. Because the switches correcting for DC offset and 1/f noise connect to the amplifier output bias circuitry, and not to the amplifier charge-sensitive inputs, one embodiment therefore overcomes the prior art limitation previously described as the Autozero-Mode Amplifier Input Offset Switch Parasitic Capacitance Limitation.

If, for example, at the end of the track interval the OUTPV-OUTPN voltage difference is positive, the GPP-GPN bias voltage difference will become slightly more positive. This voltage change will be less than the OUTPV-OUTPN voltage difference at the end of track because the small positive and negative autozero capacitor output signal voltages are divided down by filter capacitors 322-1 and 322-2, respectively. Filter capacitors 322-1 and 322, which are returned to the most positive amplifier supply voltage VPHI 322_1, act together with the smaller autozero capacitors to form what is well understood to be a lowpass switched capacitor filter. A typical capacitance ratio of the sum of the 2 smaller autozero capacitor values to the switched capacitor filter capacitor value is 1:8.

The consequence of the GPP-GPN voltage difference being driven slightly more positive at the end of the track interval may be understood with reference to the residue amplifier schematic of FIG. 6. Because GPP 373_1 connects to the gate of PMOS transistor 601-1, its current will be slightly reduced, while the bias current in PMOS transistor 601-2 will be slightly increased. This will result in a slight decrease in the OUTPV-OUTPN voltage difference to correct for the initial OUTPV-OUTPN positive output voltage difference. The slight decrease in the OUTPV-OUTPN voltage difference therefore corrects for a DC offset or 1/f input-noise-induced positive OUTPV-OUTPN difference offset in a manner that is a well understood operating principle of negative-feedback loops. Therefore, by controlling amplifier output bias current levels with a lowpass switched capacitor filter loop rather than using direct input voltage feedback, one embodiment therefore overcomes the limitations previously described as the Partially-Corrected 1/f Noise Limitation of the Devarajan reference and also the Uncorrected Amplifier DC Offset Limitation of the Rezayee reference.

It is easily understood that because the small capacitor sizes are equal, and the voltage across each pair of connected small capacitors is forced to be GPBIAS-VRP_D for one and GPBIAS-VRN_D for the other during the hold time interval, that the effective average voltage stored across both when connected to the amplifier output during the track time interval will be the difference between GPBIAS and a voltage exactly mid-way between VRP_D and VRN_D. That midway voltage is just the target quiescent common-mode amplifier output voltage VCM_OUT. If the amplifier average output voltage settles to exactly VCM_OUT, it is easily understood that the common-mode average value of the voltage being fed back to GPP or GPN at the end of the track interval will be just equal to the target PMOS gate bias voltage GPBIAS. Any increase in the amplifier common-mode output voltage will cause the voltage on GPP and GPN bias lines to increase, thereby causing the output common mode voltage to drop as a result of negative feedback. Because the offset correction feedback circuit corrects for amplifier common-mode output voltage errors, one embodiment therefore overcomes the prior art limitation previously described as the Amplifier Common-Mode Offset Correction Limitation.

8. Operation of the Stage ADC SADC

The design and operation of an MDAC stage ADC (SADC) for a pipeline ADC stage is well understood. However, in one embodiment, two SADCs are used for the SHA-less first pipeline stage, with separate SADC connections to each MDAC. With reference to FIG. 8, SADC 800-3, including comparators 821-1 through 824-1 and resistor divider network 830-1 through 834-1, is associated with MDAC 800-1. SDC 800-4, including comparators 821-2 through 824-2 and resistor divider network 830-2 through 834-2, is associated with MDAC 800-2. Because the operation of both SADCs is identical, the operation of both will be described in detail with reference to SADC 800-3.

With reference to FIG. 9, during the time interval when SADC_TP (795_1 in 800-1) is a logic 1, the positive and negative ADC capacitor analog input plates (460/461 in FIGS. 5a and 462/463 in FIG. 5b) are connected to the positive and negative inputs INP 399_1A and INN 399_2A of comparators 821-1 through 824-1. These inputs are compared to the individual comparator positive and negative input reference voltage inputs INRP and INRN of each comparator which are derived from the appropriate voltage taps on input reference voltage divider string 830-1 through 830-4. The resistor values in the divider are chosen by well understood methods that usually set the threshold values of comparators 821-1 through 824-1 to voltages that are specific fractions of the VRP_D and VRN_D voltage difference. In one embodiment, the chosen fractions are ⅛, ⅜, ⅝, and ⅞ of the reference voltage difference, respectively.

During the time interval when CKP2XF1 992_1 is a logic 0, the ADC analog input signals which have been tracked on the input plates of the capacitors in block 400 are held, and the SADC comparator CLK input logic 0 allows the comparison circuits within the comparator to regenerate. By the end of the regeneration time when CKP2XF1 transitions from a 0 to a 1, the comparator outputs 890_1A through 890_4A have reached a stable state and are then maintained in a stable state. These logic outputs on 890-1A through 890-4A are transmitted to the capacitor switching logic of switched capacitor blocks 505-B through 501-B through connections 390_1 through 390_4 as shown in FIG. 4. The individual connections from 390_4 through 390_1 to each of the switch blocks 501-B through 505B are shown as CMP_QP 390 in FIG. 5b. At the time when CKP2XF1 transitions from a 0 to a 1, the control signal HP2 (796_1 in 800-1) also transitions from 0 to 1 and the MDAC begins the hold timing interval (990_2 in FIG. 9) and the capacitors 425-1 through 428-2 are connected by the switch blocks 501-B through 505B to the appropriate positive and negative analog reference voltages VRP_D and VRN_D. During the hold timing interval, the residue amplifier 600 amplifies the voltage residue remaining on the capacitor array in a manner well understood.

The operation of SADC block 800-4 is identical to that of SADC block 800-3, except that all of the block 800-4 timing signals have been shifted one full ADC SAMPLE CLK (990_2) period. For example, the SADC comparator regeneration time interval, when CKP2XF2 (992_2) is a logic 0, is delayed one full ADC SAMPLE CLK period from CKP2XF1 (992_1).

9. Alternative Embodiments of the Invention

While the embodiment primarily described above refers to identical MDAC blocks 800-1 and 800-2 and identical SADC blocks 800-3 and 800-4, other embodiments are possible wherein elements of one, or more of the identical ADC blocks or components have been altered to be other than identical, while still being functionally equivalent to those described in one embodiment. For one example, minor modifications could be made in duplicating MDAC blocks so that they were no longer exactly identical, but achieved comparable performance. In another example, the functions of the 2 identical SADC blocks could be performed by eliminating one of them and using a single SADC block that is shared between the 2 MDAC blocks using input, output, and sampling clock multiplexing methods that are well understood by persons of ordinary skill in the art of pipeline ADC design.

The embodiment described with reference to FIG. 3a shows the 4 small autozero capacitors 320-1, 320-2 and 321-1, 321-2 switched to either the positive or negative voltage references VRP_D 381_1 or VRN_D 381_2, but it is well understood that such a switching combination has the same electrical effect as switchably connecting all 4 capacitors to a voltage mid-way between VRP_D and VRN_D. Because the voltages VRP_D and VRN_D also correspond to the limits of the opamp analog output voltage swing, a reference voltage set mid-way between these voltages is the optimum target voltage setting for the opamp output common-mode voltage VCM_OUT. An arrangement for switching just 2 of the small autozero capacitors 321-1 and 321-2 to VCM_OUT is shown in a second embodiment of the autozero circuit in FIG. 3b. The capacitors are switchably connected to VCM_OUT (385) through switches 305-3 and 305-4 in FIG. 3b, which are controlled by the same switch control signal HP_A. The logic signals controlling the switches in FIG. 3b are identical in design and timing to those shown in FIGS. 7a and 7b which are used to control the switches in FIG. 3a. In this second embodiment of the autozero circuit, the small autozero capacitors are doubled in value to retain the same performance described above. The autozero circuit of the second embodiment of FIG. 3b appears simpler, but requires an additional reference supply voltage circuit to supply VCM_OUT. Therefore this arrangement was not used in the first-described embodiment.

Whereas the main embodiment described refers to an MDAC operated with a given sequence and length of timing events described with reference to FIG. 9, it is possible to eliminate the DAC portion of the MDAC and use the remaining duplicate in circuitry in 800-1 and 800-2 to perform only the TRACK and HOLD functions of a SHA. In such case, the SHA may be used, for example, as the front end circuitry for a conventional pipeline ADC while retaining several of the performance advantages herein described for a SHA-less ADC. A combination of elements including CMOS switches and devices is primarily described, but other combinations of CMOS switches or circuit elements, such as alternative embodiments of the switched capacitor networks of FIGS. 5a and 5b, corresponding control logic of FIGS. 7a and 7b, or the OTA amplifier of FIG. 6, may be used to emulate the functions of the invention It should also be understood that while one embodiment as described herein refers to a given sequence and length of timing events described with reference to FIG. 9, it is possible to perform minor modifications altering the sequence or length of timing events described herein which will still permit the MDACs and SADCs to combine both the TRACK and HOLD functions of an SHA-less ADC, but most-likely with inferior performance as compared with some other embodiments.

It should also be understood that while one embodiment as described herein refers to a combination of elements including CMOS switches and devices, that other present, or future solid-state devices, such as J-FET, bipolar, or other devices, may be used to emulate the circuit design and operating principles taught herein.

It should also be understood that while one embodiment as described herein refers to a combination of elements forming the first stage of a pipeline ADC, the improvement is also applicable to forming a SHA-less first stage ADCs with other topologies, such as flash or successive-approximation ADCs (SAR-ADC). The embodiments of the invention disclosed herein such as resetting the input sampling capacitor while maintaining a long tracking time interval would definitely benefit the input stage of either a flash or a SAR-ADC. In the case of the SAR-ADC it would be appropriate to provide additional HOLD time to allow the gain of the residue amplifier to be increased, thereby providing the additional settling time required by one or more successive approximations.

It should also be understood that while one embodiment as described herein refers to 2 identical MDAC blocks 800-1 and 800-2 and 2 identical SADC blocks 800-3 and 800-4, other embodiments are possible wherein all of these blocks are once again duplicated, to form another pipeline SHA-less ADC first stage, and either connected to the same input signal directly, or through input buffer amplifiers (BAMPs) to the same input signal. In such case the elements of one of the additional SHA-less ADC first stage must be operated with timing control signals that are all time-delayed by one-half of the ADC SAMPLE CLK time period from the other ADC stage, and that the outputs of each first stage must be connected to successive pipeline stages that are separate. While such an ADC is capable of quantizing analog input signals at twice the sample frequency of the ADC SAMPLE CLK, even higher ADC sample rates, such as 4 times the basic sample rate, may be obtained by again duplicating all of the structures described above and operating each of the 4 identical SHA-less pipeline ADC first stages with timing control signals that delayed in time by one-quarter of the ADC SAMPLE CLK period.

What is claimed is:

1. An sample-and-hold-plus-amplifier (SHA)-less first-stage circuit in an analog-to-digital converter (ADC) having circuitry for both tracking an input signal and sampling and holding that input signal on a plurality of sampling capacitors to perform an analog-to-digital conversion of the sampled input signal in a HOLD mode, the SHA-less first-stage ADC circuit comprising:
   a duplicate single SHA-less ADC first-stage circuit forming a combined SHA-less first stage ADC circuit including a first single SHA-less ADC first-stage circuit having a first residue amplifier and a second single SHA-less ADC first-stage circuit having a second residue amplifier, in which
   an analog input of the first single SHA-less ADC first-stage circuit and an analog input of the second single SHA-less ADC first-stage circuit are connected to an analog input of the combined SHA-less first stage ADC circuit;
   the analog output a first single SHA-less ADC first-stage circuit and the analog output of the second single SHA-less ADC first-stage circuit are connected to the analog output of the combined SHA-less first stage ADC circuit;
   the input and output of the plurality of sampling capacitors are switchably connected to first fixed-voltage references during a portion of the time when the plurality of sampling capacitors of the second single SHA-less ADC first stage is connected to the combined first stage SHA-less ADC input, whereby the plurality of sampling capacitors of the first single SHA-less ADC first stage is reset;
   the plurality of sampling capacitors of the first single SHA-less ADC first stage is switchably connected to the combined SHA-less first stage ADC input for a period of time which begins before the HOLD period of the second single SHA-less ADC first stage;
   the input and output of the plurality of sampling capacitors is switchably connected to second fixed-voltage references during a portion of the time when the plurality of sampling capacitors of the first single SHA-less ADC first stage is connected to the combined first stage SHA-less ADC input, whereby the plurality of sampling capacitors of the second single SHA-less ADC first single stage is reset; and
   the plurality of sampling capacitors of the second single SHA-less ADC first single stage is switchably connected to the combined SHA-less first stage ADC input for a period of time which begins before the HOLD period of the first single SHA-less ADC first stage.

2. A circuit as defined in claim 1, in which the first single SHA-less ADC first-stage circuit and the second single SHA-less ADC first-stage circuit comprise the combined SHA-less first stage ADC circuit of a pipeline ADC and includes a multiplying DAC (MDAC) and a residue amplifier (RAMP) for generating an analog residue output value.

3. A circuit as defined in claim 2, in which the analog input of the first single SHA-less ADC first-stage residue amplifier is connected to the analog input of the second single SHA-less ADC first-stage residue amplifier and the analog output of the first single SHA-less ADC first-stage residue amplifier is connected to the analog output of the second single SHA-less ADC first-stage residue amplifier.

4. A circuit as defined in claim 3, in which the residue amplifier is an operational transconductance amplifier.

5. A circuit as in claim 1, in which:
   the ADC is a pipeline analog-to-digital converter (ADC); and
   the plurality of sampling capacitors performs analog-to-digital conversion of the sampled input signal at an analog input signal sampling clock rate having a periodicity equal to an input signal sampling clock time period.

6. An ADC as defined in claim 1, in which:
   the ADC tracks the input signal in a TRACK mode; and
   input plates of the plurality of sampling capacitors in the first single SHA-less ADC first-stage circuit are switchably disconnected from the combined ADC input at the end of the TRACK time interval for one quarter of the sampling clock time period prior to connecting the input plates of selected ones of the plurality of sampling capacitors to either the residue amplifier output or to a reference voltage at the beginning of the HOLD time interval.

7. An ADC as defined in claim 1, in which an analog input of the first single SHA-less ADC first-single stage circuit residue amplifier is connected to an analog input of the second single SHA-less ADC first-stage circuit residue amplifier, and an analog output of the first single SHA-less ADC first-stage circuit residue amplifier is connected to an analog output of the second SHA-less ADC first-stage circuit residue amplifier.

8. An ADC as defined in claim 1, in which the plurality of sampling capacitors of the first single SHA-less ADC first stage are switchably connected to the combined SHA-less first stage ADC input for a period of time equal to one-quarter of a signal sampling clock time period before the HOLD period of the second single SHA-less ADC first stage.

9. An ADC as defined in claim 1, in which switchably disconnecting the plurality of sampling capacitors of the first single SHA-less ADC first stage to the combined SHA-less first stage ADC input after a period of time which begins after the end of the HOLD period of the second single SHA-less ADC first stage.

10. An ADC as defined in claim 1, in which the plurality of sampling capacitors of the first single SHA-less ADC first stage is switchably disconnected to the combined SHA-less first stage ADC input after a period of time equal to one-quarter of a signal sampling clock time period after the end of the HOLD period of the second single SHA-less ADC first stage.

11. An autozero circuit for an operational amplifier having a positive and negative input, a positive and negative output, and first and second bias transistor having current-control terminals, comprising:
 first, second, and third reference voltages;
 first and second small autozero capacitor elements;
 first and second filter capacitor elements, each having first and second terminals;
 said second terminal of the first and second filter capacitors being connected to the first reference voltage, and said first bias transistor current-control terminal being connected to the first terminal of the first filter capacitor;
 in which:
 the second bias transistor current-control terminal is connected to the first terminal of the second filter capacitor;
 a first plurality of switches is included and is operative in a first, RESET clock phase, switchably connecting the first autozero capacitor between the operational amplifier positive output and the first bias transistor current-control terminal during the RESET phase;
 a second plurality of switches is included and is operative in the first clock phase, switchably connecting the second autozero capacitor between the operational amplifier negative output and the second bias transistor current-control terminal during the RESET clock phase;
 a third plurality of switches is included and is operative in a second, OPERATIONAL clock phase, switchably connecting the first autozero capacitor between the second voltage reference and the third voltage reference during the OPERATIONAL clock phase; and
 a fourth plurality of switches operative in the second clock phase, switchably connecting the second autozero capacitor between the second voltage reference and the third voltage reference during the OPERATIONAL phase.

12. An autozero circuit as in claim 11, in which the first and second small autozero capacitor elements and first and second filter capacitor elements operate in conjunction with the plurality of switches between the autozero capacitor elements and the filter capacitor elements to form a lowpass switched capacitor filter.

13. An autozero circuit as in claim 11, in which an operational amplifier positive output and negative output are switchably connected together during a first portion of the RESET phase.

14. An autozero circuit for an operational amplifier as in claim 13, in which the first portion of the RESET phase is the first half of the RESET phase.

15. An autozero circuit for an operational amplifier as in claim 11, in which the operational amplifier is a residue amplifier in the multiplying DAC portion of a pipeline analog to digital converter (ADC).

16. An autozero circuit for an operational amplifier as in claim 11, in which the operational amplifier is an operational transconductance amplifier.

17. An autozero circuit for an operational amplifier as in claim 11, in which the current control terminals of the operational amplifier are the gates of PMOS transistors.

18. An autozero circuit for an operational amplifier having a positive and negative input, a positive and negative output, and first and second bias transistor having current-control terminals, comprising:
 First, second, third, and fourth reference voltages;
 first, second, third and fourth small autozero capacitor elements;
 first and second filter capacitor elements, each having first and second terminals, the second terminal of the first and second filter capacitors being connected to the first reference voltage, the first bias transistor current-control terminal being connected to the first terminal of the first filter capacitor, and the second bias transistor current-control terminal being connected to the first terminal of the second filter capacitor;
 a first plurality of switches operative in a first, RESET clock phase, switchably connecting the first and second autozero capacitors between the operational amplifier positive output and the first bias transistor current-control terminal during the RESET phase;
 a second plurality of switches operative in the first, RESET clock phase, switchably connecting the third and fourth autozero capacitors between the operational amplifier negative output and the second bias transistor current-control terminal during the RESET phase;
 a third plurality of switches operative in a second, OPERATIONAL clock phase, switchably connecting the first autozero capacitor between the second voltage reference and the fourth voltage reference during the OPERATIONAL phase;
 a fourth plurality of switches operative in the second, OPERATIONAL clock phase, switchably connecting the second autozero capacitor between the second voltage reference and the third voltage reference during the OPERATIONAL phase;
 a fifth plurality of switches operative in the second, OPERATIONAL clock phase, switchably connecting the third autozero capacitor between the second voltage reference, and the fourth voltage reference during the OPERATIONAL phase;
 a sixth plurality of switches operative in the second, OPERATIONAL clock phase, switchably connecting the fourth autozero capacitor between the second voltage reference and the third voltage reference during the OPERATIONAL phase; and
 the first, second, third, and fourth small autozero capacitor elements and first and second filter capacitor elements operate in conjunction with the first and second plurality of switches between the autozero capacitor elements and the filter capacitor elements to form a lowpass switched capacitor filter.

19. An autozero circuit as in claim 18, in which an operational amplifier positive output and negative output are switchably connected together during a first portion of the RESET phase.

20. An autozero circuit as in claim 19, in which the first portion of the RESET phase is the first-half of the RESET phase.

21. An autozero circuit as in claim 18, in which the operational amplifier is a residue amplifier in a pipeline analog to digital converter (ADC).

22. An autozero circuit as in claim 18, in which the operational amplifier is an operational transconductance amplifier.

23. An autozero circuit as in claim 18, in which the current control terminals of the operational amplifier are the gates of PMOS transistors.

\* \* \* \* \*